United States Patent
Horiguchi et al.

(10) Patent No.: US 12,407,342 B2
(45) Date of Patent: Sep. 2, 2025

(54) DRIVE CIRCUIT TO DRIVE POWER SEMICONDUCTOR ELEMENT, POWER SEMICONDUCTOR MODULE, AND POWER CONVERSION DEVICE

(71) Applicant: Mitsubishi Electric Corporation, Tokyo (JP)

(72) Inventors: Takeshi Horiguchi, Tokyo (JP); Takashi Masuhara, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 18/689,436

(22) PCT Filed: Oct. 13, 2021

(86) PCT No.: PCT/JP2021/037882
§ 371 (c)(1),
(2) Date: Mar. 6, 2024

(87) PCT Pub. No.: WO2023/062745
PCT Pub. Date: Apr. 20, 2023

(65) Prior Publication Data
US 2025/0007507 A1    Jan. 2, 2025

(51) Int. Cl.
*H03K 17/08*    (2006.01)
(52) U.S. Cl.
CPC .................. *H03K 17/08* (2013.01)
(58) Field of Classification Search
CPC ... H03K 17/08; H03K 17/082; H03K 17/0822
USPC .................................................. 327/108, 109
See application file for complete search history.

(56) References Cited

U.S. PATENT DOCUMENTS

| | | | | |
|---|---|---|---|---|
| 5,475,329 A | * | 12/1995 | Jones | H03K 17/04206 327/309 |
| 5,550,701 A | * | 8/1996 | Nadd | H03K 17/0822 361/103 |
| 5,608,595 A | * | 3/1997 | Gourab | H03K 17/0826 361/88 |

(Continued)

FOREIGN PATENT DOCUMENTS

| | | |
|---|---|---|
| GB | 2533677 A | 6/2016 |
| JP | 2005-192394 A | 7/2005 |

(Continued)

OTHER PUBLICATIONS

International Search Report and Written Opinion mailed on Dec. 21, 2021, received for PCT Application PCT/JP2021/037882, filed on Oct. 13, 2021, 8 pages including English Translation.

*Primary Examiner* — William Hernandez
(74) *Attorney, Agent, or Firm* — XSENSUS LLP

(57) ABSTRACT

A drive circuit for a power semiconductor element includes a voltage clamp circuit connected between a first main electrode and a control electrode and a second turn-off circuit including a capacitive element and a switching element connected in series between the control electrode and a second main electrode and a resistive element connected in parallel to the capacitive element. A turn-off control circuit switches the switching element in the second turn-off circuit to on when a voltage across the first main electrode and the second main electrode increases after start of turn-off of the power semiconductor element.

14 Claims, 20 Drawing Sheets

(56) References Cited

U.S. PATENT DOCUMENTS

| | | | |
|---|---|---|---|
| 6,169,439 B1 * | 1/2001 | Teggatz | H03K 17/0822 |
| | | | 327/309 |
| 6,275,399 B1 | 8/2001 | Miyazaki et al. | |
| 2013/0155560 A1 | 6/2013 | Takeuchi | |
| 2019/0158083 A1 | 5/2019 | Horiguchi | |

FOREIGN PATENT DOCUMENTS

| | | |
|---|---|---|
| JP | 2013-126278 A | 6/2013 |
| JP | 2016-086490 A | 5/2016 |
| WO | 2018/008398 A1 | 1/2018 |

\* cited by examiner

DRIVE CIRCUIT TO DRIVE POWER SEMICONDUCTOR ELEMENT, POWER SEMICONDUCTOR MODULE, AND POWER CONVERSION DEVICE

CROSS-REFERENCE TO RELATED APPLICATION

This application is based on PCT filing PCT/JP2021/037882, filed Oct. 13, 2021, the entire contents of which are incorporated herein by reference.

TECHNICAL FIELD

The present disclosure relates to a drive circuit to drive a power semiconductor element, a power semiconductor module, and a power conversion device.

BACKGROUND ART

An overvoltage may occur due to a surge voltage generated when a power semiconductor element is turned off. One of measures to prevent such an overvoltage is connection of a voltage clamp circuit including a constant voltage diode between a main electrode on a high potential side and a control electrode of the power semiconductor element. When a voltage across the main electrode on the high potential side and the control electrode reaches an operating voltage level of the voltage clamp circuit, the voltage of the main electrode on the high potential side is clamped at a constant voltage and a current flows from the main electrode on the high potential side to the control electrode through the voltage clamp circuit. At this time, however, a time period for a turn-off operation becomes long due to increase in voltage of the control electrode, and hence such a side effect as increase in turn-off loss is caused.

Japanese Patent Laying-Open No. 2016-86490 (PTL 1) discloses a technique to change an output-stage impedance connected to a control electrode in accordance with a value of a detected voltage of the control electrode in order to suppress increase in turn-off loss. Specifically, as surge is damped, a clamp current decreases, and consequently the voltage of the control electrode lowers. Thereafter, when a mirror period ends and when lowering in voltage of the control electrode to a value not larger than a defined value is detected, an output-stage circuit lowers the output-stage impedance.

CITATION LIST

Patent Literature

PTL 1: Japanese Patent Laying-Open No. 2016-86490

SUMMARY OF INVENTION

Technical Problem

In the method described in Japanese Patent Laying-Open No. 2016-86490 (PTL 1) above, however, suppression of turn-off loss may not be sufficient. Specifically, for both of a period during which the voltage across the main electrode on the high potential side and the control electrode varies and a period during which a main current that flows between main electrodes varies, the output-stage impedance is maintained at a large value. Therefore, turn-off loss is large for these periods.

The present disclosure was made in consideration of problems above, and one of objects thereof is to provide a drive circuit to drive a power semiconductor element, to achieve both of suppression of a surge voltage and reduction in turn-off loss.

Solution to Problem

In one embodiment, a drive circuit for a power semiconductor element is provided. The power semiconductor element includes a first main electrode on a high potential side, a second main electrode on a low potential side, and a control electrode. A state between the first main electrode and the second main electrode is switched between a conducting state and a non-conducting state in accordance with a voltage applied to the control electrode. The drive circuit includes a turn-on circuit, a first turn-off circuit, a voltage clamp circuit, a second turn-off circuit, and a turn-off control circuit. The turn-on circuit turns on the power semiconductor element by applying a first supply voltage to the control electrode in accordance with an on command from a controller. The first turn-off circuit turns off the power semiconductor element by applying a second supply voltage to the control electrode in accordance with an off command from the controller. The voltage clamp circuit is connected between the first main electrode and the control electrode. The second turn-off circuit includes a capacitive element and a switching element connected in series between the control electrode and the second main electrode and a resistive element connected in parallel to the capacitive element. The turn-off control circuit controls on and off of the switching element in the second turn-off circuit. The turn-off control circuit switches the switching element to on when a voltage across the first main electrode and the second main electrode increases after start of turn-off of the power semiconductor element by the first turn-off circuit.

Advantageous Effects of Invention

According to the drive circuit in one embodiment above, when a voltage across the first main electrode and the second main electrode increases after start of turn-off of the power semiconductor element, the switching element is switched to on. Both of suppression of the surge voltage and reduction in turn-off loss can thus be achieved.

DESCRIPTION OF EMBODIMENTS

Figure 1:
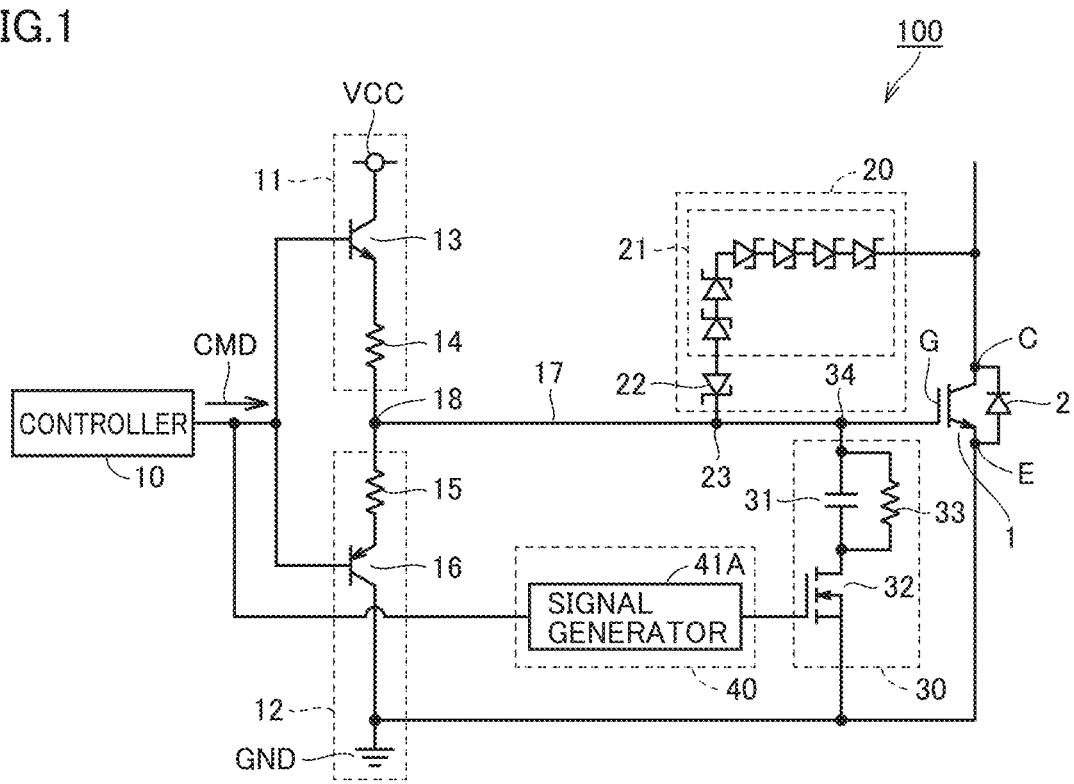
FIG. 1 is a circuit diagram showing a configuration of a drive circuit to drive a power semiconductor element according to a first embodiment.

Each embodiment will be described in detail below with reference to the drawings. In the description below, the positive logic is used for logical operation. Specifically, the high level (H level) is allocated to an active state ("1") and the low level (L level) is allocated to an inactive state ("0"). The present disclosure, however, is applicable also to the negative logic. In the description below, the same or corresponding elements have the same reference characters allotted and description thereof may not be repeated.

First Embodiment

[Exemplary Configuration of Drive Circuit]

FIG. 1 is a circuit diagram showing a configuration of a drive circuit 100 to drive a power semiconductor element 1 according to a first embodiment. A power semiconductor module is composed of power semiconductor element 1 and drive circuit 100. In this case, the power semiconductor module may be composed of power semiconductor element 1 and drive circuit 100 as being integrated or separate from each other.

Power semiconductor element 1 switches a state between a first main electrode C (collector) on a high potential side and a second main electrode E (emitter) on a low potential side between a conducting (on) state and a non-conducting (off) state in accordance with a voltage applied to a control electrode G (gate). The voltage applied to control electrode G is generated by drive circuit 100 based on a command signal CMD provided from a controller 10. Though FIG. 1 illustrates an insulated gate bipolar transistor (IGBT) as power semiconductor element 1, the power semiconductor element is not limited to the IGBT. For example, a power semiconductor element of another type such as a power metal-oxide-semiconductor field effect transistor (MOSFET) or a reverse conducting IGBT (RC-IGBT) may be employed. A material to be used for power semiconductor element 1 is not limited to Si, and another semiconductor material such as SiC, GaN, or $Ga_2O_3$ may be employed. A freewheeling diode 2 is connected in anti-parallel to power semiconductor element 1.

Drive circuit 100 includes a turn-on circuit 11, a first turn-off circuit 12, a second turn-off circuit 30, a turn-off control circuit 40, and a voltage clamp circuit 20.

As shown in FIG. 1, turn-on circuit 11 includes a semiconductor switching element 13 and an on gate resistor 14. Semiconductor switching element 13 and on gate resistor 14 are connected in this order between a node (which is referred to as a VCC node below) provided with a supply voltage VCC and an intermediate node 18. First turn-off circuit 12 includes a semiconductor switching element 16 and an off gate resistor 15. Semiconductor switching element 16 and off gate resistor 15 are connected in this order between a node (which is referred to as a GND node below) provided with a ground potential GND and intermediate node 18. Intermediate node 18 is connected to control electrode G of power semiconductor element 1 through a control electrode line 17. The GND node is connected to second main electrode E of power semiconductor element 1.

In the present disclosure, more generally, supply voltage VCC may be referred to as a first supply voltage and ground potential GND may be referred to as a second supply voltage. The VCC node may be referred to as a first power supply node and the GND node may be referred to as a second power supply node.

In the case of FIG. 1, an NPN bipolar transistor is employed as semiconductor switching element 13. A PNP bipolar transistor is employed as semiconductor switching element 16. Without being limited as such, for example, a P-channel MOSFET may be employed as semiconductor switching element 13, an N-channel MOSFET may be employed as semiconductor switching element 16, or a semiconductor switching element of another conductivity type or another type may be employed.

By receiving an on command as command signal CMD from controller 10, semiconductor switching element 13 makes transition to an on state and semiconductor switching element 16 makes transition to an off state. In the case of FIG. 1, the on command is a voltage at the H level. Since control electrode G of power semiconductor element 1 is thus connected to the VCC node, power semiconductor element 1 is rendered conductive.

By receiving an off command as command signal CMD from controller 10, on the other hand, semiconductor switching element 13 makes transition to the off state and semiconductor switching element 16 makes transition to the on state. In the case of FIG. 1, the off command is a voltage at the L level. Since control electrode G of power semiconductor element 1 is thus connected to the GND node, power semiconductor element 1 is rendered non-conductive.

Second turn-off circuit 30 is connected between a node 34 on control electrode line 17 and second main electrode E of power semiconductor element 1. A connection node 34 is closer to control electrode G than intermediate node 18. As shown in FIG. 1, by way of example, second turn-off circuit 30 includes a capacitor 31 (which is also referred to as a capacitive element), a semiconductor switching element 32, and a resistor 33. Capacitor 31 and semiconductor switching element 32 are connected in this order between node 34 (that is, control electrode G) and second main electrode E. Resistor 33 is connected in parallel to capacitor 31. A passive component portion is composed of capacitor 31 and resistor 33. While semiconductor switching element 32 is off, second turn-off circuit 30 (that is, a portion between control electrode G and second main electrode E) is rendered non-conductive, and while semiconductor switching element 32 is on, second turn-off circuit 30 is rendered conductive.

In the case of FIG. 1, an N-channel MOSFET is employed as semiconductor switching element 32. Without being limited as such, for example, an NPN bipolar transistor or a semiconductor switching element of another conductivity type or another type may be employed as semiconductor switching element 32.

Turn-off control circuit 40 switches semiconductor switching element 32 in second turn-off circuit 30 to on when power semiconductor element 1 is turned off, that is, when a voltage (a collector-emitter voltage Vce) across first main electrode C and second main electrode E increases (that is, during increase) after semiconductor switching element 13 in turn-on circuit 11 is turned off and semiconductor switching element 16 in first turn-off circuit 12 is turned on. Desirably, timing of switching of semiconductor switching element 32 is timing of start of increase in voltage across first main electrode C and second main electrode E (collector-emitter voltage Vce). Thereafter, turn-off control circuit 40 sets semiconductor switching element 32 back to off after lapse of a certain time period.

In the embodiment shown in FIG. 1, turn-off control circuit 40 includes a signal generator 41A. When signal generator 41A receives the off command as command signal CMD from controller 10, it outputs a pulsed signal set to the H level for a certain time period for controlling semiconductor switching element 32 to be conducting.

When second turn-off circuit 30 is rendered conductive as semiconductor switching element 32 is turned on, a current flows from control electrode G of power semiconductor element 1 to the GND node through two paths including a path through first turn-off circuit 12. A current path through first turn-off circuit 12 does not include a capacitor, whereas a current path through second turn-off circuit 30 is provided with capacitor 31 in series with semiconductor switching element 32. Therefore, immediately after turn-on of semiconductor switching element 32, a current instantaneously flows through second turn-off circuit 30. The current that flows through second turn-off circuit 30 is thus significantly dominant than the current that flows through first turn-off circuit 12. Since a turn-off operation period (that is, a period until the current that flows through second turn-off circuit 30 becomes steady) of second turn-off circuit 30 is uniquely determined by a capacitance of capacitor 31, it is irrelevant to a period during which a pulsed signal outputted from signal generator 41A is at the high level. A turn-off current through second turn-off circuit 30 is thus dominant only for a very short period in accordance with the capacitance of capacitor 31.

The capacitance of capacitor 31 is set such that a transient current actually flows through second turn-off circuit 30 for a desired period. Specifically, a capacitance value of capacitor 31 is desirably set such that collector-emitter voltage Vce is substantially clamped at the time when the current through capacitor 31 attains to 0.

Voltage clamp circuit 20 is a circuit connected between first main electrode C on the high potential side and control electrode G of power semiconductor element 1 to clamp a voltage across first main electrode C and control electrode G. In an exemplary configuration shown in FIG. 1, voltage clamp circuit 20 includes at least one (six) Zener diode 21 (which is also referred to as a first diode) and a backflow prevention diode 22 (which is also referred to as a second diode) connected in series with each other in this order between first main electrode C and control electrode G. Each Zener diode 21 has a cathode connected to a side of first main electrode C. Backflow prevention diode 22 has a cathode connected to a side of control electrode G. The number of Zener diodes 21 is appropriately set such that the sum of breakdown voltages of Zener diodes 21 does not exceed a rated voltage of power semiconductor element 1. Backflow prevention diode 22 may be or may not be of a Zener type.

In general, reduction in loss caused in a power semiconductor element is important for achievement of reduction in size and higher efficiency of a power conversion device including the power semiconductor element. Loss caused in the power semiconductor element includes switching loss caused in a transient state of a switching operation and conduction loss caused in the conducting state. Conduction loss is mainly determined by characteristics of the power semiconductor element, whereas switching loss can be reduced by devising a method of driving the power semiconductor element.

Switching loss can be categorized into turn-on loss caused in a turn-on operation and turn-off loss caused in a turn-off operation. In order to reduce turn-off loss, a method of decreasing a turn-off time period, that is, increasing a switching speed, is available.

Decrease in turn-off time period, however, brings about a problem of increase in surge voltage. Specifically, a surge voltage expressed as Ls×dI/dt is generated, where Ls represents a parasitic inductance in a main circuit of the power conversion device and dI/dt represents change over time in current (collector current) that flows between the main electrodes. Therefore, when the switching speed is increased and dI/dt becomes high, the surge voltage becomes higher. Thus, there is trade-off relation between the turn-off loss and the surge voltage.

Voltage clamp circuit 20 suppresses an overvoltage involved with the surge voltage. Specifically, in the turn-off operation, the voltage across first main electrode C and second main electrode E increases. At this time, when the voltage across the main electrodes becomes excessively high due to the surge voltage, Zener diode 21 in voltage clamp circuit 20 breaks down and the current flows to control electrode G. Since power semiconductor element 1 is consequently temporarily rendered conductive, the voltage of first main electrode C on the high potential side can be maintained at a constant value. On the other hand, since a time period for the turn-off operation becomes longer due to a clamping operation by voltage clamp circuit 20, increase in turn-off loss is disadvantageously caused. Further detailed description will be given below with reference to waveforms of a voltage and a current of each element at the time of turn-off.

[Current and Voltage Waveforms in Drive Circuit in Comparative Example]

Figure 2:
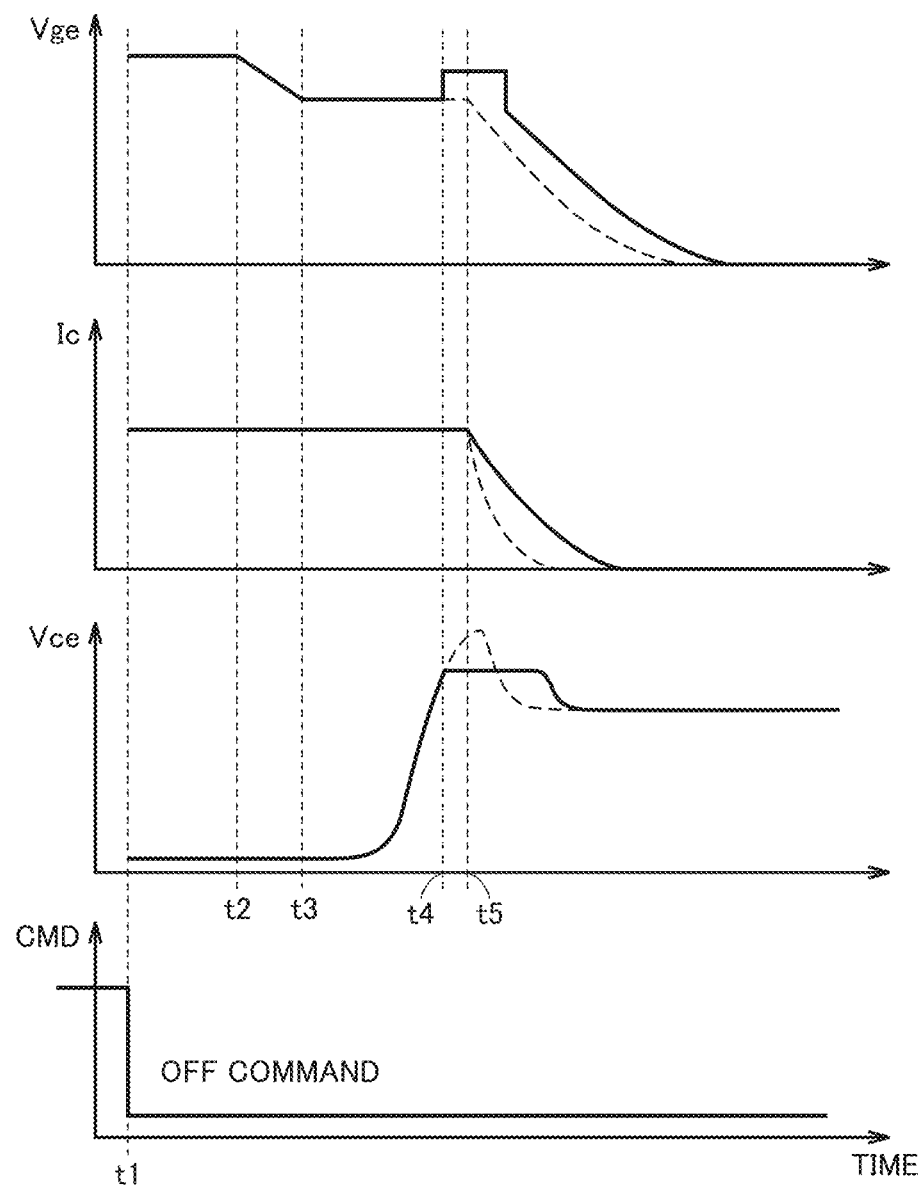
FIG. 2 is a diagram schematically showing a voltage or current waveform of each element at the time of turn-off by a drive circuit in a comparative example in which a second turn-off circuit in FIG. 1 is not provided.

FIG. 2 is a diagram schematically showing a voltage or current waveform of each element at the time of turn-off by a drive circuit in a comparative example in which second turn-off circuit 30 in FIG. 1 is not provided. FIG. 2 schematically shows sequentially from the top, a waveform of each of a voltage Vge (which is also referred to as a "gate-emitter voltage") across control electrode G and second main electrode E of power semiconductor element 1, a main current Ic (which is also referred to as a "collector current") that flows between the main electrodes of power semiconductor element 1, voltage Vce (which is also referred to as the "collector-emitter voltage") across the main electrodes of power semiconductor element 1, and command signal CMD. A solid line indicates the waveform of the voltage or the current when voltage clamp circuit 20 performs the clamping operation and a dashed line indicates the waveform of the voltage or the current when voltage clamp circuit 20 is not provided.

Referring to FIG. 2, at time t1, command signal CMD outputted from controller 10 in FIG. 1 switches from the H level (on command) to the L level (off command). Semiconductor switching element 13 in turn-on circuit 11 thus switches to off and semiconductor switching element 16 in first turn-off circuit 12 switches to on. Consequently, charges accumulated in control electrode G of power semiconductor element 1 start to flow out through control electrode line 17 and first turn-off circuit 12.

In the example in which voltage clamp circuit 20 is not provided (the dashed line in FIG. 2), gate-emitter voltage Vge starts to lower at time t2, and further lowers through a mirror period from time t3 to time t5. Collector-emitter voltage Vce increases from time t3 when the mirror period comes, and when the collector-emitter voltage reaches a direct-current (DC) link voltage (a voltage applied in the non-conducting state), collector current Ic starts to lower.

In the example in which voltage clamp circuit 20 is provided (the solid line in FIG. 2), on the other hand, when collector-emitter voltage Vce becomes higher than a clamp voltage set by voltage clamp circuit 20 at time t4, Zener diode 21 in voltage clamp circuit 20 breaks down and the current flows from first main electrode C (collector) to control electrode G (gate). Gate-emitter voltage Vge voltage thus increases and collector-emitter voltage Vce is clamped. Since collector-emitter voltage Vce is thus clamped by voltage clamp circuit 20, the surge voltage is suppressed. In the example in which voltage clamp circuit 20 is provided, however, the period for the turn-off operation of power semiconductor element 1 is longer, and hence a problem of increase in turn-off loss arises.

[Current and Voltage Waveforms in Drive Circuit in First Embodiment]

Figure 3:
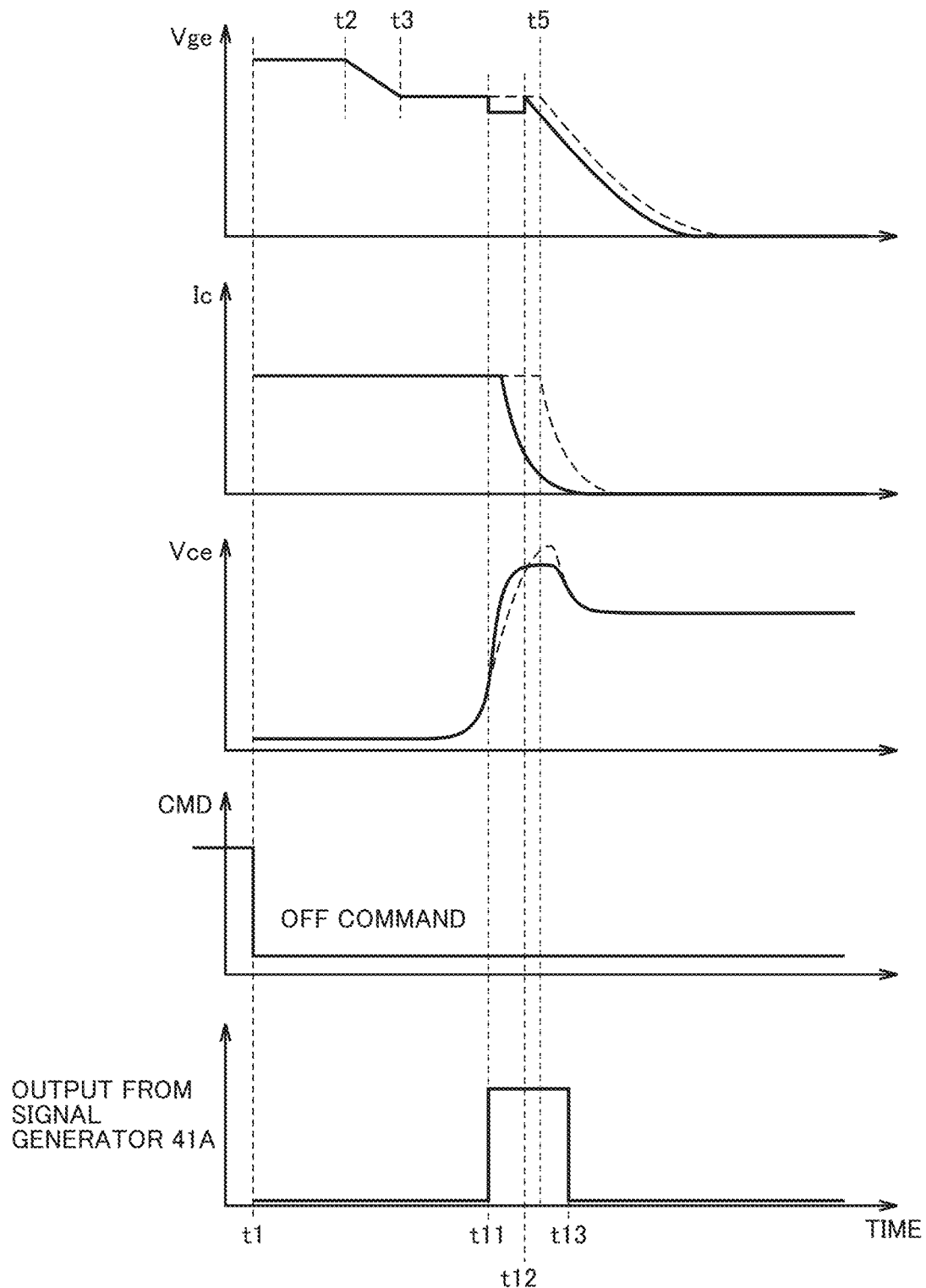
FIG. 3 is a diagram schematically showing a voltage or current waveform of each element at the time of turn-off by the drive circuit in the first embodiment shown in FIG. 1.

FIG. 3 is a diagram schematically showing a voltage or current waveform of each element at the time of turn-off by the drive circuit in the first embodiment shown in FIG. 1. FIG. 3 shows sequentially from the top, a waveform of each of gate-emitter voltage Vge of power semiconductor element 1, collector current Ic, collector-emitter voltage Vce, command signal CMD, and an output voltage from signal generator 41A. The solid line indicates the waveform of the voltage or the current in the case of drive circuit 100 in the first embodiment. The dashed line indicates the waveform of the voltage or the current in the case of the comparative example in which neither of voltage clamp circuit 20 and second turn-off circuit 30 is provided in FIG. 1. Variation in waveform at time t1, time t2, time t3, and time t5 is the same as in FIG. 2.

At time t11 at which collector-emitter voltage Vce starts to increase, signal generator 41A switches the output voltage therefrom to the H level. Since semiconductor switching element 32 is thus rendered conductive, the gate current suddenly flows through capacitor 31 in second turn-off circuit 30. Consequently, gate-emitter voltage Vge lowers, collector current Ic decreases, and collector-emitter voltage Vce increases.

The gate current through capacitor 31 stops at next time t12. A period from time t11 to time t12 is determined by the capacitance of capacitor 31. Therefore, the capacitance value of capacitor 31 is determined in advance such that increase in collector-emitter voltage Vce is also substantially clamped at time t12. Thereafter, at any timing (time t13) before next start of turn-on of power semiconductor element 1, signal generator 41A sets the output voltage therefrom back to the L level to set semiconductor switching element 32 to off.

As set forth above, in the turn-off operation of power semiconductor element 1, at least while the voltage across the main electrodes (collector-emitter voltage Vce) of power semiconductor element 1 keeps increasing, signal generator 41A maintains the output signal at the high level such that semiconductor switching element 32 is conducting. Furthermore, the capacitance value of capacitor 31 is set such that the gate current flows through capacitor 31 only for a period during which collector-emitter voltage Vce increases. In other words, the capacitance value of capacitor 31 is set such that increase in collector-emitter voltage Vce is also clamped at the time when the current no longer flows through capacitor 31.

Thus, the period during which the current flows through second turn-off circuit 30 is set depending on the capacitance value of capacitor 31, rather than the period during which semiconductor switching element 32 is conducting. It is difficult to control semiconductor switching element 32 with a pulsed signal having a pulse width as short as one hundred nanoseconds to actually allow the current to flow through second turn-off circuit 30 during the period of increase in collector-emitter voltage Vce. In contrast, it is easy to determine the period during which the current flows through second turn-off circuit 30 based on the capacitance value of the capacitor.

Furthermore, in second turn-off circuit 30 in FIG. 1, resistor 33 is connected in parallel to capacitor 31. The reason therefor will be explained. When a power conversion device is assumed as an application of the power semiconductor element, the power semiconductor element is controlled to successively perform the switching operation. In other words, the turn-off operation is repeatedly performed. Therefore, in order to have the second turn-off circuit operate in every turn-off operation, charges accumulated in capacitor 31 should be released each time the turn-off operation ends. Resistor 33 is provided for discharging of capacitor 31 in such a case. In actual, when semiconductor switching element 32 is turned off, charges accumulated in capacitor 31 are discharged. In consideration of a carrier frequency and a minimum off pulse width in a pulse width modulation (PWM) signal with which the power conversion device is driven, a time constant (more generally, the time constant of the passive component portion) determined by capacitor 31 and resistor 33 is desirably not longer than five microseconds.

Effects of First Embodiment

As set forth above, according to drive circuit 100 to drive power semiconductor element 1 in the first embodiment, voltage clamp circuit 20 is provided between first main electrode C on the high potential side and control electrode G of power semiconductor element 1 and second turn-off circuit 30 is provided between control electrode G and second main electrode E on the low potential side. Unlike first turn-off circuit 12, second turn-off circuit 30 includes capacitor 31 provided in series with semiconductor switching element 32. Furthermore, resistor 33 is connected in parallel to capacitor 31.

Turn-off control circuit 40 to control semiconductor switching element 32 in second turn-off circuit 30 turns on semiconductor switching element 32 during the turn-off period after first turn-off circuit 12 is rendered conductive. Since a current larger than the current that flows through first turn-off circuit 12 flows through capacitor 31 at this time, the voltage (collector-emitter voltage Vce) across the main electrodes of power semiconductor element 1 can be increased in a shorter period of time. In other words, since variation in voltage (dV/dt) at the time of turn-off of power semiconductor element 1 becomes steeper, turn-off loss can be reduced. The capacitance value of capacitor 31 is set such that a period during which the current transiently flows through capacitor 31 is substantially equal to a period until collector-emitter voltage Vce reaches the DC link voltage after semiconductor switching element 32 switches to on. Turn-off control circuit 40 turns off semiconductor switching element 32 at any timing after collector-emitter voltage Vce reaches the DC link voltage. Therefore, the period during which turn-off control circuit 40 controls semiconductor switching element 32 to on is longer than a period of increase in voltage (collector-emitter voltage Vce) across the main electrodes of power semiconductor element 1 from 0 to a maximum value.

Since voltage clamp circuit 20 is provided in drive circuit 100, a surge voltage involved with variation in current (dI/dt) in the turn-off operation of power semiconductor element 1 can be suppressed. Since trade-off between the turn-off loss and the surge voltage can thus be overcome, reduction in size and higher efficiency of a power converter including power semiconductor element 1 can be achieved.

Modification of First Embodiment

In drive circuit 100 in the present first embodiment, on gate resistor 14 and off gate resistor 15 are provided independently of each other. In contrast, the effect as above is obtained also when a common gate resistor for both of turn-on and turn-off is provided in control electrode line 17.

Second Embodiment

Figure 4:
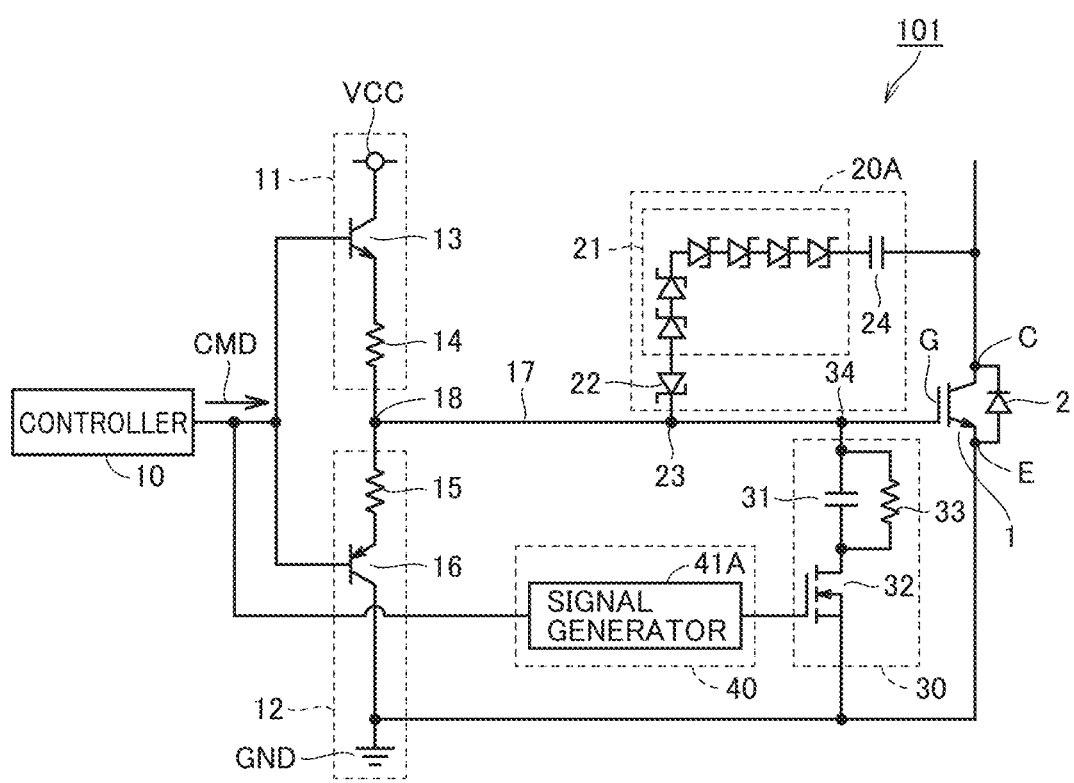
FIG. 4 is a circuit diagram showing a configuration of a drive circuit to drive the power semiconductor element according to a second embodiment.

FIG. 4 is a circuit diagram showing a configuration of a drive circuit 101 to drive power semiconductor element 1 according to a second embodiment.

Drive circuit 101 in the second embodiment is different from drive circuit 100 in the first embodiment in that a voltage clamp circuit 20A further includes a capacitor 24 connected in series with a plurality of Zener diodes 21. In an example shown in FIG. 4, capacitor 24 is connected between first main electrode C of power semiconductor element 1 and the plurality of Zener diodes 21. Since FIG. 4 is otherwise similar to FIG. 1, the same or corresponding elements have the same reference numerals allotted and description will not be repeated.

A DC current can be cut off by providing capacitor 24. Therefore, even when a DC voltage steadily applied across first main electrode C and second main electrode E of power semiconductor element 1 is higher than a clamp voltage determined by the number of Zener diodes 21, the DC current does not flow through voltage clamp circuit 20.

Other effects of drive circuit 101 in the second embodiment are similar to those of drive circuit 100 in the first embodiment. Specifically, charges in control electrode G are discharged through capacitor 31 as semiconductor switching element 32 in second turn-off circuit 30 is rendered conductive during the turn-off period of power semiconductor element 1. Consequently, since variation in voltage (dV/dt) at the time of turn-off can be steeper, turn-off loss can be reduced. Since drive circuit 101 further includes the voltage clamp circuit, the surge voltage generated across the main electrodes can be suppressed.

Third Embodiment

Figure 5:
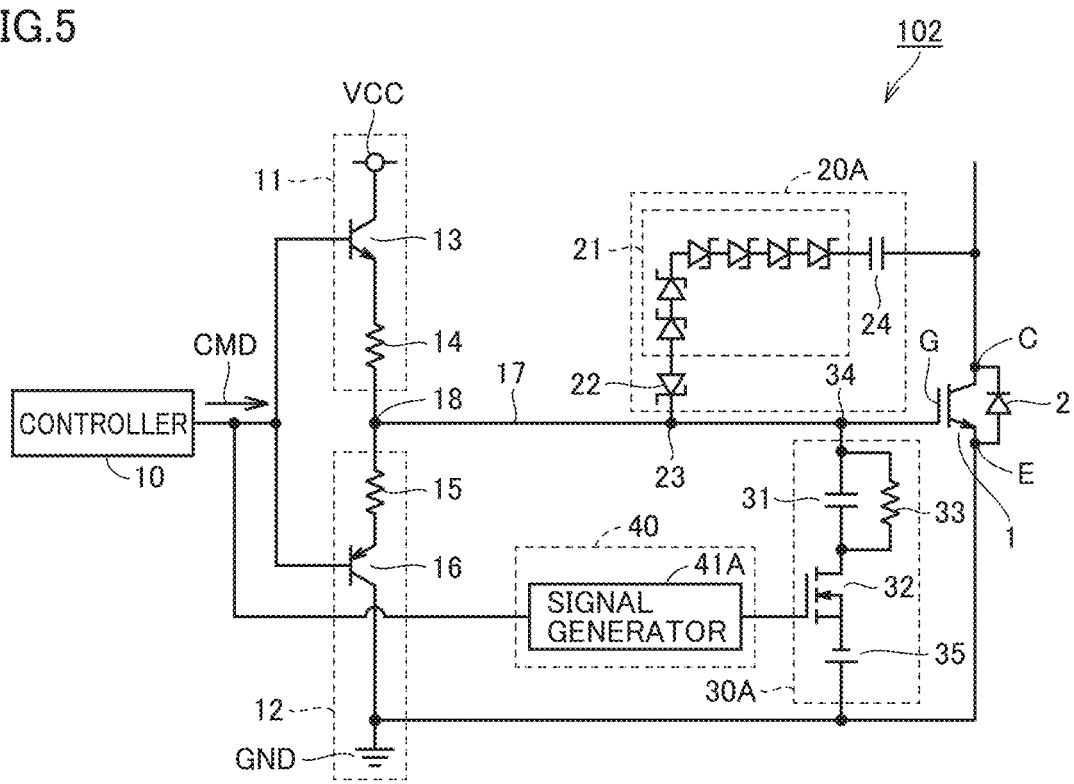
FIG. 5 is a circuit diagram showing a configuration of a drive circuit to drive the power semiconductor element according to a third embodiment.

FIG. 5 is a circuit diagram showing a configuration of a drive circuit 102 to drive power semiconductor element 1 according to a third embodiment.

Drive circuit 102 in the third embodiment is different from drive circuit 101 in the second embodiment in that a second turn-off circuit 30A further includes a negative power supply 35. In second turn-off circuit 30A shown in FIG. 5, capacitor 31, semiconductor switching element 32, and negative power supply 35 are connected in series in this order between connection node 34 and the GND node (therefore, between control electrode G and second main electrode E). Specifically, negative power supply 35 has a positive electrode connected to the GND node and has a negative electrode connected to the main electrode (emitter) on the low potential side of semiconductor switching element 32.

According to the configuration, a potential difference between the control electrode (gate) and the main electrode (emitter) on the low potential side of semiconductor switching element 32 becomes larger. The current that flows in second turn-off circuit 30A through semiconductor switching element 32 can thus be larger. Consequently, the rate of increase in collector-emitter voltage Vce at the time of turn-off of power semiconductor element 1 can further be higher and thus the effect of reduction in turn-off loss can further be enhanced.

Since FIG. 5 is otherwise the same as FIGS. 1 and 4 described above, the same or corresponding elements have the same reference numerals allotted and description will not be repeated.

Figure 6:
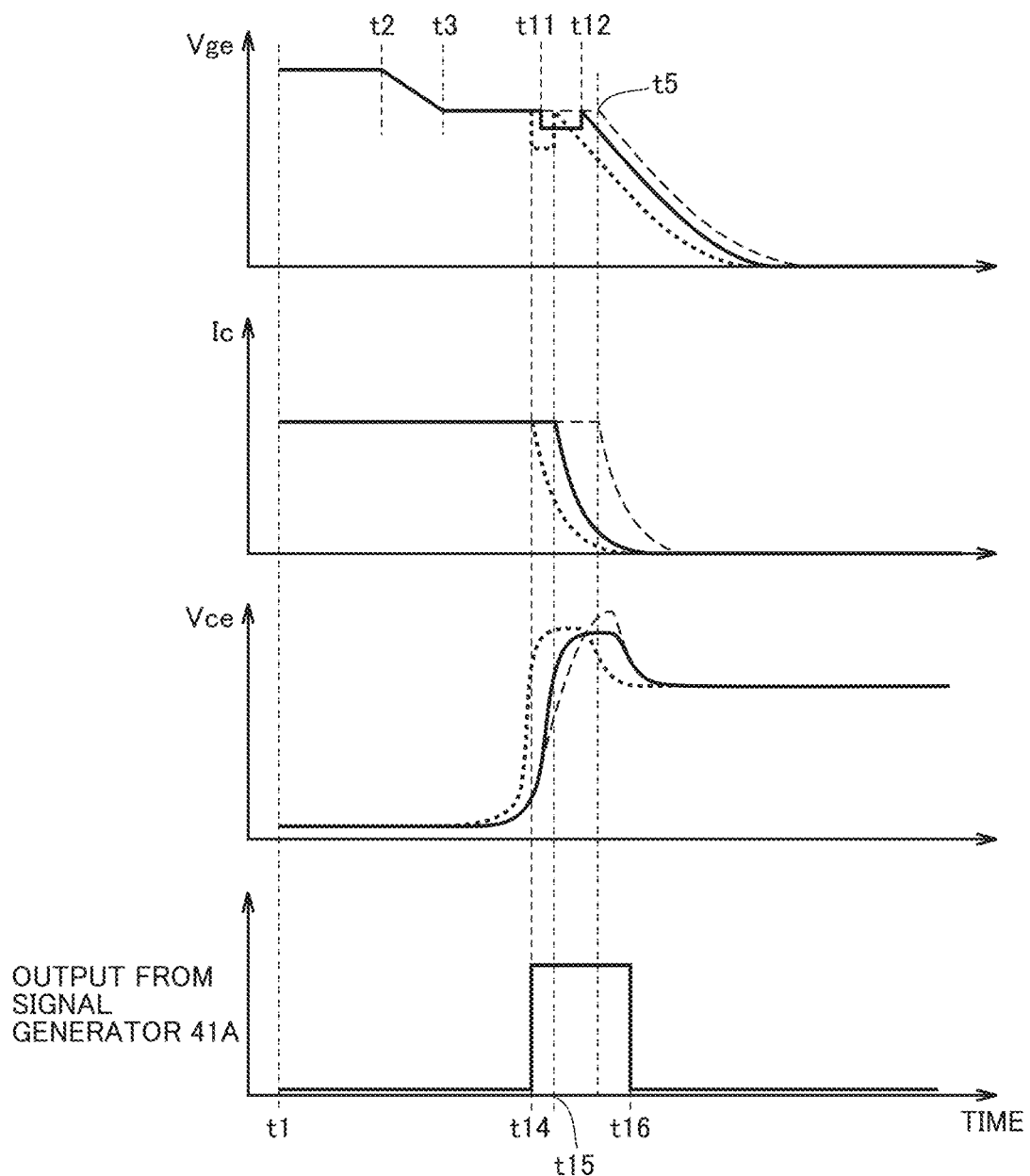
FIG. 6 is a diagram schematically showing a voltage or current waveform of each element at the time of turn-off by the drive circuit in the third embodiment shown in FIG. 5.

FIG. 6 is a diagram schematically showing a voltage or current waveform of each element at the time of turn-off by drive circuit 102 in the third embodiment shown in FIG. 5. FIG. 6 schematically shows sequentially from the top, a waveform of each of gate-emitter voltage Vge of power semiconductor element 1, collector current Ic, collector-emitter voltage Vce, and an output voltage from signal generator 41A. The solid line indicates the waveform of the voltage or the current in the case of drive circuit 100 in the first embodiment. The dashed line indicates the waveform of the voltage or the current in the case of the comparative example in which neither of voltage clamp circuit 20 and second turn-off circuit 30 is provided in FIG. 1. A dotted line indicates the waveform of the voltage or the current in the case of drive circuit 102 in the third embodiment. Variation in waveform at time t2, time t3, and time t5 is the same as in FIG. 2.

As shown with the waveform drawn with the dotted line, in drive circuit 102 in the present embodiment, at time t14 at which collector-emitter voltage Vce starts to increase, signal generator 41A switches the output voltage therefrom to the H level. Since semiconductor switching element 32 is thus rendered conductive, a current suddenly flows through capacitor 31 in second turn-off circuit 30A. At this time, the current that flows through second turn-off circuit 30A is larger than in the case of second turn-off circuit 30 in the first embodiment (the solid line in FIG. 6). Consequently, an amount of lowering in gate-emitter voltage Vge is larger than in the first embodiment, the rate of decrease in collector current Ic is higher than in the first embodiment, and the rate of increase in collector-emitter voltage Vce is higher than in the first embodiment.

At time t15, increase in collector-emitter voltage Vce is substantially clamped. The capacitance value of capacitor 31 is set such that the current that flows through capacitor 31 in second turn-off circuit 30A also stops at this time. Thereafter, at any timing (time t16) before next start of turn-on of power semiconductor element 1, signal generator 41A sets the output voltage therefrom back to the L level to turn off semiconductor switching element 32. As shown in FIG. 6, a period during which the current flows through capacitor 31 in the third embodiment is from time t14 until time t15. This period is shorter than a period from time t11 until time t12 in the first embodiment.

As set forth above, according to drive circuit 102 to drive power semiconductor element 1 in the third embodiment, negative power supply 35 is connected in series on the low potential side of semiconductor switching element 32 in second turn-off circuit 30A. Since the current that flows through semiconductor switching element 32 can thus be increased while semiconductor switching element 32 is on, the rate of turn-off of power semiconductor element 1 can further be higher. Consequently, variation in voltage (dV/dt) of power semiconductor element 1 can be steep and further reduction in turn-off loss can be achieved. Since drive circuit 102 includes voltage clamp circuit 20A as in the first and second embodiments, the surge voltage transiently generated across the main electrodes of power semiconductor element 1 at the time of turn-off can be suppressed.

The configuration of second turn-off circuit 30A further including negative power supply 35 can also be combined with any of drive circuits 103 to 111 in fourth to ninth embodiments which will be described later.

Fourth Embodiment

Figure 7:
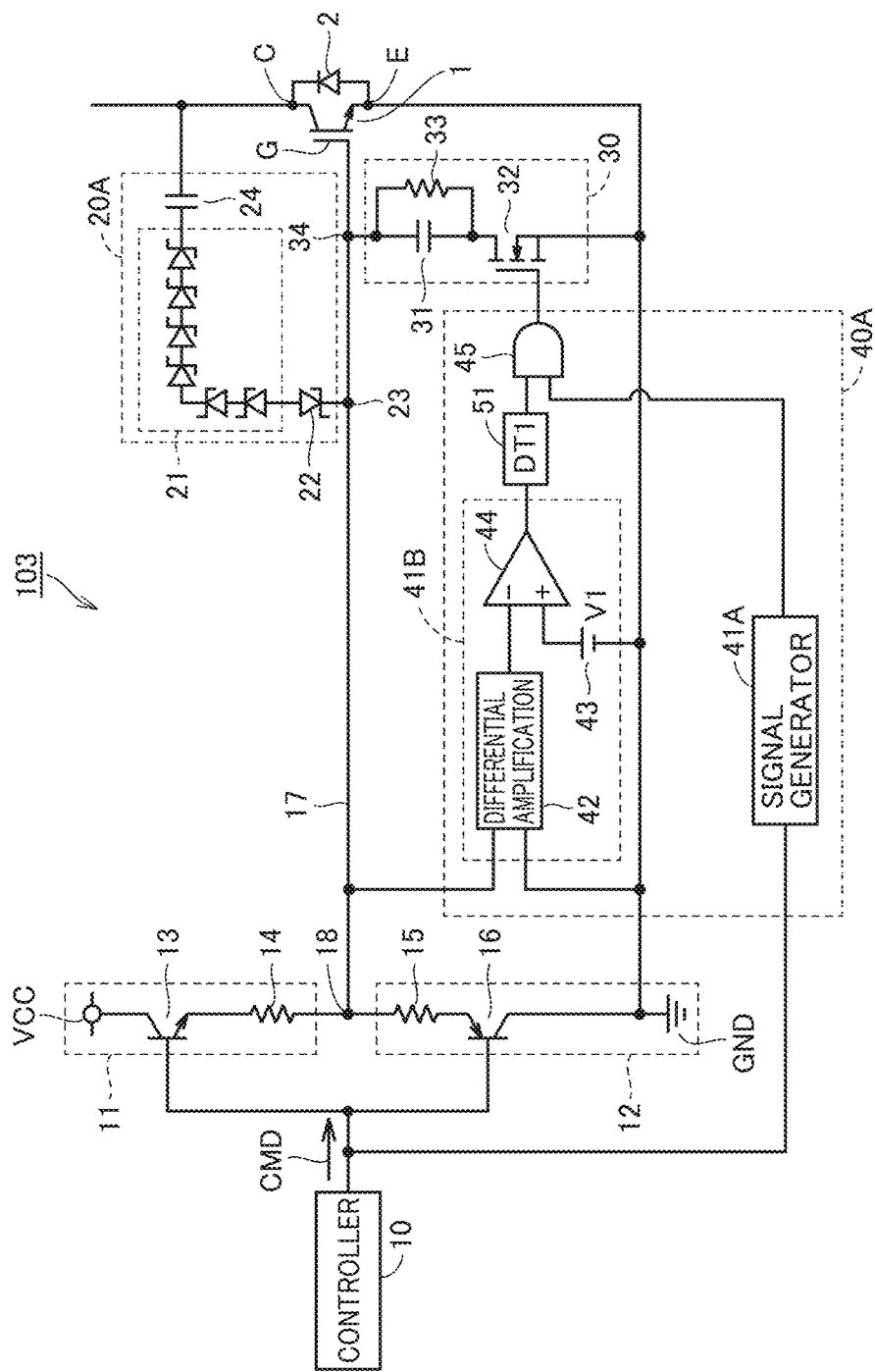
FIG. 7 is a circuit diagram showing a configuration of a drive circuit to drive the power semiconductor element according to a fourth embodiment.

FIG. 7 is a circuit diagram showing a configuration of a drive circuit 103 to drive power semiconductor element 1 according to a fourth embodiment. Drive circuit 103 in the fourth embodiment is different from drive circuits 100 to 102 in the first to third embodiments in that a turn-off control circuit 40A further includes a second signal generator 41B, a delay circuit 51, and an arithmetic logic unit 45 in addition to first signal generator 41A described in the first to third embodiments.

As described already, first signal generator 41A outputs a pulsed signal set to the H level for a certain period based on command signal CMD (off command) outputted from controller 10.

Second signal generator 41B detects a voltage across control electrode G and second main electrode E on the low potential side of power semiconductor element 1 and outputs a pulsed signal set to the H level for a certain period when the detected voltage becomes lower than a reference voltage V1. Reference voltage V1 is set to a value smaller than the voltage of control electrode G while power semiconductor element 1 is on and larger than a mirror voltage at the time of turn-off of power semiconductor element 1.

Delay circuit 51 delays timing of switching of output from second signal generator 41B from the L level to the H level by predetermined delay time DT1. Timing of switching of semiconductor switching element 32 from off to on can thus be adjusted. When timing of turn-on of semiconductor switching element 32 is adjustable with delay time in each of a later-described comparator 44 and arithmetic logic unit 45 included in second signal generator 41B, delay circuit 51 does not have to be provided. Delay circuit 51 may be provided between arithmetic logic unit 45 and control electrode G of semiconductor switching element 32.

When a signal obtained by delay of an output signal from second signal generator 41B by delay circuit 51 and an output signal from first signal generator 41A are both at the H level, arithmetic logic unit 45 outputs a signal at the H level to control electrode G of semiconductor switching element 32. Semiconductor switching element 32 is thus rendered conductive. Arithmetic logic unit 45 thus performs a logical AND operation of a plurality of input signals.

As shown in FIG. 7, more specifically, second signal generator 41B includes a differential amplifier 42, a DC power supply 43, and a comparator 44. Differential amplifier 42 functions as a control voltage detection circuit to detect a control voltage (gate-emitter voltage Vge) across control electrode G and second main electrode E on the low potential side of power semiconductor element 1. Comparator 44 compares an output voltage from differential amplifier 42 and an output voltage from DC power supply 43 with each other, and when the output voltage from differential amplifier 42 is lower than the output voltage from DC power supply 43, it outputs a signal at the H level.

Since FIG. 7 is otherwise similar to FIGS. 1 and 4, the same or corresponding elements have the same reference numerals allotted and description will not be repeated. Drive circuit 103 in the fourth embodiment can be combined with second turn-off circuit 30A including negative power supply 35 in the third embodiment.

Figure 8:
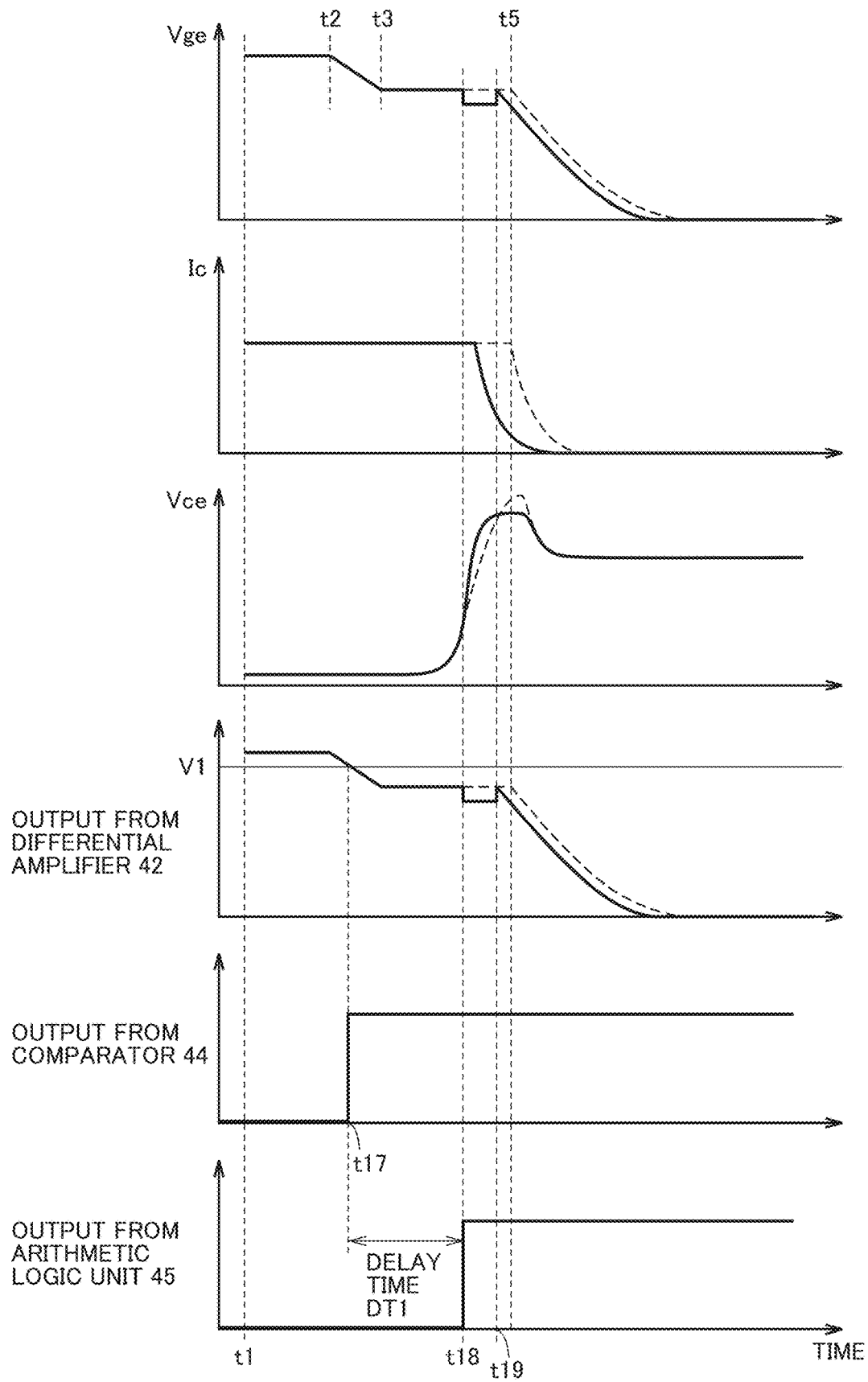
FIG. 8 is a diagram schematically showing a voltage or current waveform of each element at the time of turn-off by the drive circuit in the fourth embodiment shown in FIG. 7.

FIG. 8 is a diagram schematically showing a voltage or current waveform of each element at the time of turn-off by drive circuit 103 in the fourth embodiment shown in FIG. 7. FIG. 8 schematically shows sequentially from the top, a waveform of each of gate-emitter voltage Vge of power semiconductor element 1, collector current Ic, collector-emitter voltage Vce, an output voltage from differential amplifier 42, an output voltage from comparator 44, and an output voltage from arithmetic logic unit 45. The solid line indicates the waveform of the voltage or the current in the case of drive circuit 103 in the fourth embodiment. The dashed line indicates the waveform of the voltage or the current in the case of the comparative example in which neither of voltage clamp circuit 20 and second turn-off circuit 30 is provided in FIG. 1. Variation in waveform at time t2, time t3, and time t5 is the same as in FIG. 2.

At time t17 in FIG. 8, the output voltage from differential amplifier 42 (that is, gate-emitter voltage Vge of power semiconductor element 1) becomes lower than reference voltage V1. The output voltage from comparator 44 thus switches from the L level to the H level. The output signal from first signal generator 41A is assumed to have already switched from the L level to the H level at the time when the first signal generator receives the off command from controller 10.

At time t18 after lapse of delay time DT1 by delay circuit 51 since time t17, the output voltage from arithmetic logic unit 45 switches from the L level to the H level. Since semiconductor switching element 32 is thus rendered conductive, the current suddenly flows through capacitor 31 in second turn-off circuit 30. Consequently, gate-emitter voltage Vge lowers, collector current Ic decreases, and collector-emitter voltage Vce increases. At next time t19, the current through capacitor 31 stops. A period from time t18 until time t19 is determined by the capacitance of capacitor 31. Therefore, the capacitance value of capacitor 31 is determined in advance such that increase in collector-emitter voltage Vce is also substantially clamped at time t19. Thereafter, at any timing before next start of turn-on of power semiconductor element 1, first and second signal generators 41A and 41B set respective output voltages therefrom back to the L level to turn off semiconductor switching element 32.

Effects of Fourth Embodiment

In the turn-off operation, during a mirror period during which gate-emitter voltage Vge is constant, collector-emitter voltage Vce increases. Therefore, as shown in FIG. 8, reference voltage V1 is set to a value slightly higher than a mirror voltage, and furthermore, delay time DT1 by delay circuit 51 and a delay time produced in comparator 44 and arithmetic logic unit 45 are taken into consideration. Thus, at time t18 which is timing of start of increase in collector-emitter voltage Vce as a result of the operation of first turn-off circuit 12, semiconductor switching element 32 in second turn-off circuit 30 can be switched to the conducting state. Consequently, variation in voltage (dV/dt) of power semiconductor element 1 can be steep, and further reduction in turn-off loss can be achieved. Since drive circuit 103 further includes voltage clamp circuit 20A, the voltage across the main electrodes (that is, collector-emitter voltage Vce) of power semiconductor element 1 can be suppressed.

In drive circuit 103 in the fourth embodiment, first signal generator 41A is provided to have second turn-off circuit 30 operate at the time of turn-on of power semiconductor element 1 based on switching of command signal CMD from controller 10 from the on command to the off command. Timing of switching from off to on of semiconductor switching element 32 is determined by second signal generator 41B.

Fifth Embodiment

Figure 9:
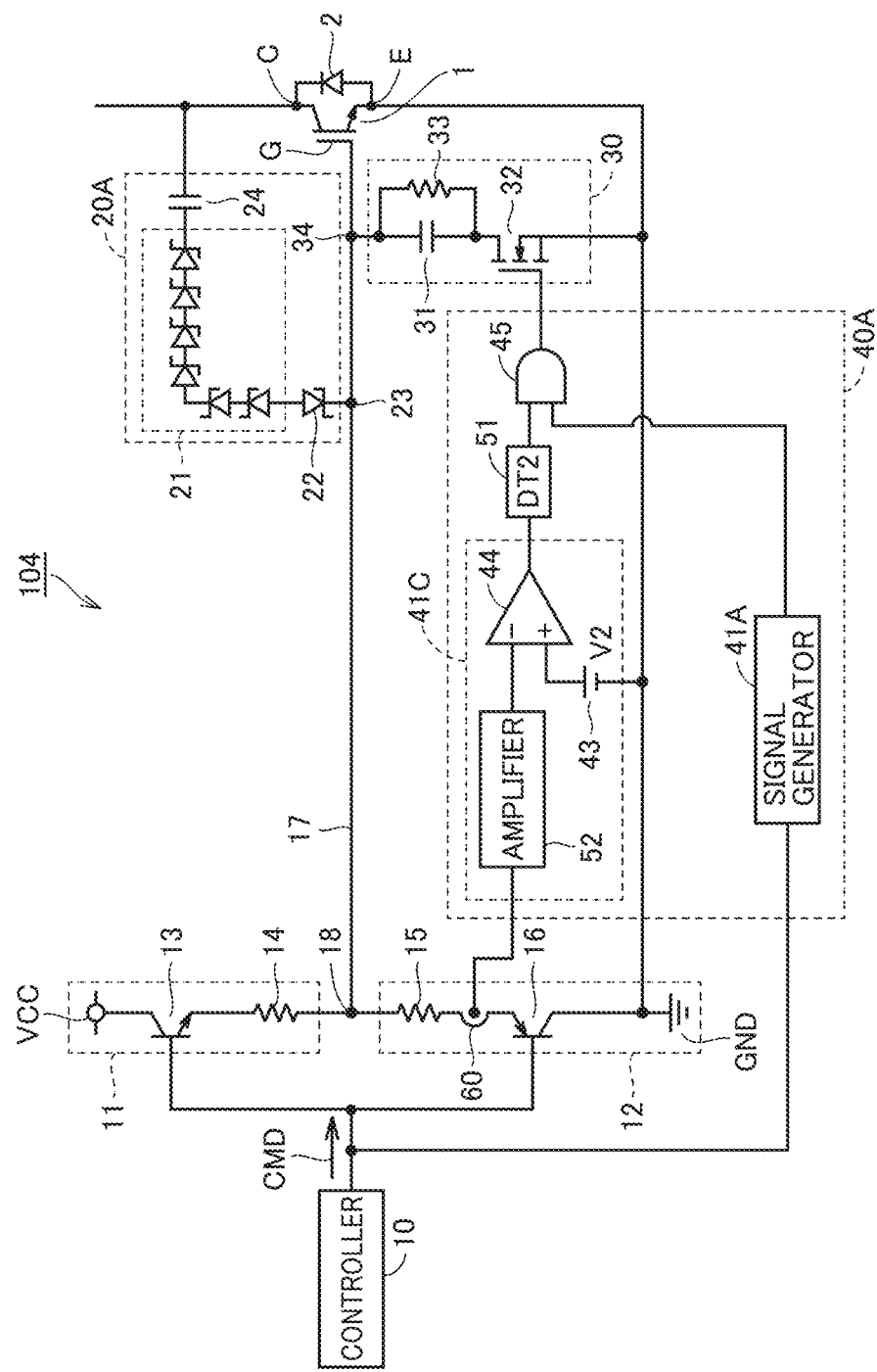
FIG. 9 is a circuit diagram showing a configuration of a drive circuit to drive the power semiconductor element according to a fifth embodiment.

FIG. 9 is a circuit diagram showing a configuration of a drive circuit 104 to drive power semiconductor element 1 according to a fifth embodiment. In drive circuit 104 in the fifth embodiment, a second signal generator 41C is different in function from second signal generator 41B in drive circuit 103 in the fourth embodiment.

Specifically, second signal generator 41C in FIG. 9 obtains a value of a current detected by a current sensor 60 provided on a current path in first turn-off circuit 12. Second signal generator 41C then outputs a pulsed signal set to the H level for a certain period when an absolute value of the detected current value attains to a peak value and thereafter becomes smaller than a reference value (corresponding to a reference voltage V2).

As shown in FIG. 9, more specifically, signal generator 41C includes an amplifier 52, comparator 44, and DC power supply 43. Amplifier 52 obtains a value of a gate current detected by current sensor 60 at the time of turn-off of power semiconductor element 1. Amplifier 52 may be configured as a differential amplifier that obtains a differential signal from current sensor 60. Comparator 44 compares an absolute value of the detection value from current sensor 60 outputted from amplifier 52 with reference voltage V2 outputted from DC power supply 43. Comparator 44 outputs the pulsed signal set to the H level for a certain period when the absolute value of the gate current detection value outputted from amplifier 52 exceeds the peak value and thereafter becomes smaller than reference voltage V2.

Since FIG. 9 is otherwise similar in configuration to FIG. 7, the same or corresponding elements have the same reference numerals allotted and description will not be repeated.

Figure 10:
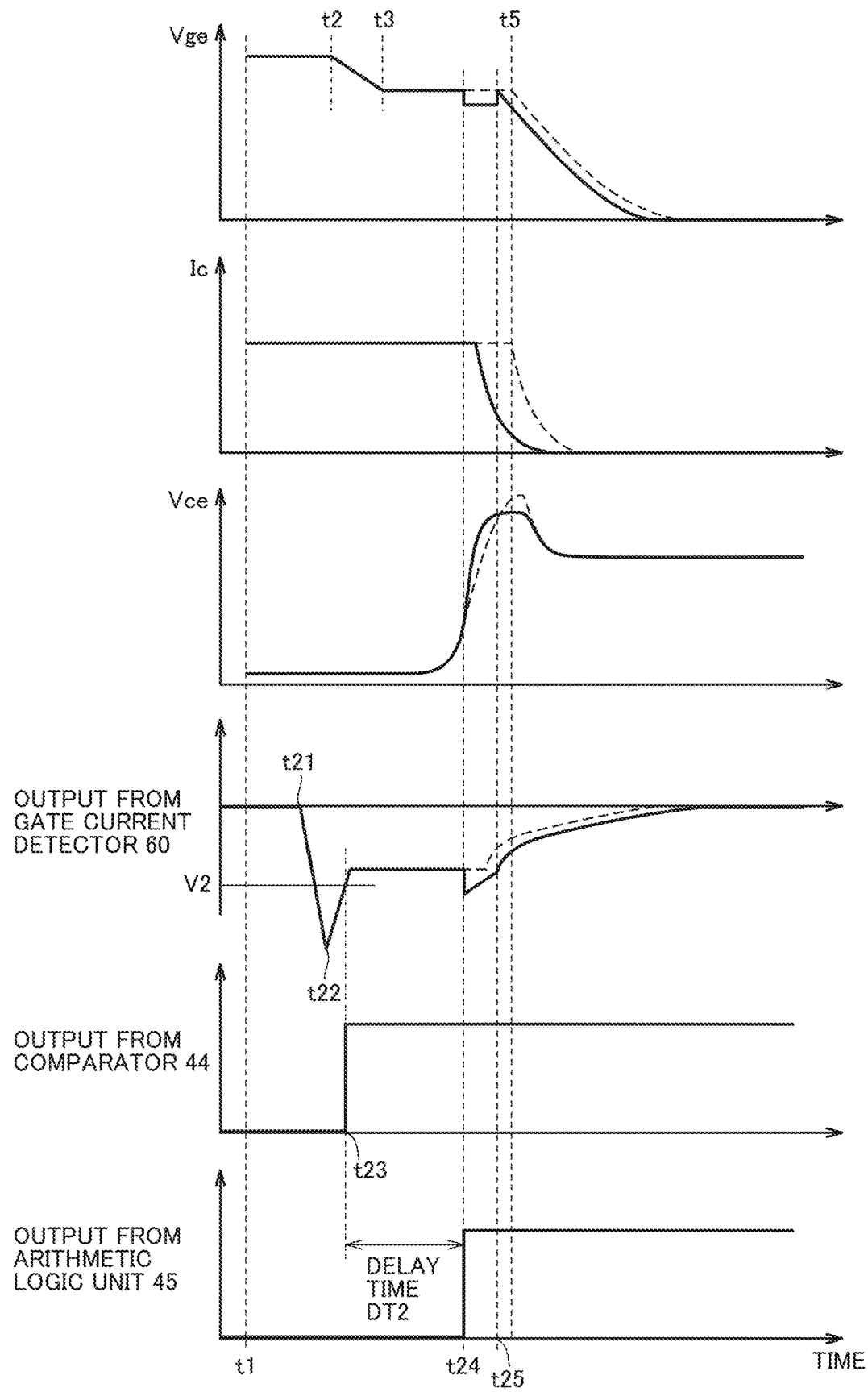
FIG. 10 is a diagram schematically showing a voltage or current waveform of each element at the time of turn-off by the drive circuit in the fifth embodiment shown in FIG. 9.

FIG. 10 is a diagram schematically showing a voltage or current waveform of each element at the time of turn-off by drive circuit 104 in the fifth embodiment shown in FIG. 9. FIG. 10 shows sequentially from the top, a waveform of each of gate-emitter voltage Vge of power semiconductor element 1, collector current Ic, collector-emitter voltage Vce, an output voltage from current sensor 60 as a gate current detector, an output voltage from comparator 44, and an output voltage from arithmetic logic unit 45. The solid line indicates the waveform of the voltage or the current in the case of drive circuit 104 in the fifth embodiment. The dashed line indicates the waveform of the voltage or the current in the case of the comparative example in which neither of voltage clamp circuit 20 and second turn-off circuit 30 is provided in FIG. 1. Variation in waveform at time t2, time t3, and time t5 is the same as in FIG. 2. A value of the gate current is defined as being positive when the gate current flows in a direction from intermediate node 18 toward control electrode G of power semiconductor element 1 and being negative when it flows in a direction reverse thereto.

The gate current starts to flow at time t21 in FIG. 10 and attains to the peak value at time t22. Thereafter, at time t23 at which the absolute value of the gate current becomes smaller than the reference value (corresponding to reference voltage V2), the output voltage from comparator 44 switches from the L level to the H level. An output signal from first signal generator 41A is assumed to have already switched from the L level to the H level when the first signal generator receives the off command from controller 10.

At time t24 after lapse of delay time DT2 by delay circuit 51 since time t23, the output voltage from arithmetic logic unit 45 switches from the L level to the H level. Since semiconductor switching element 32 is thus rendered conductive, the current suddenly flows through capacitor 31 in second turn-off circuit 30. Consequently, gate-emitter voltage Vge lowers, collector current Ic decreases, collector-emitter voltage Vce increases, and the absolute value of the gate current increases. At next time t25, the current through capacitor 31 stops. A period from time t24 until time t25 is determined by the capacitance of capacitor 31. Therefore, the capacitance value of capacitor 31 is determined in advance such that increase in collector-emitter voltage Vce is also substantially clamped at time t25.

Thereafter, at any timing before next start of turn-on of power semiconductor element 1, first and second signal generators 41A and 41C set respective output voltages therefrom back to the L level to set semiconductor switching element 32 to off.

Effects of Fifth Embodiment

As set forth above, according to drive circuit 104 to drive power semiconductor element 1 in the fifth embodiment, operation timing of semiconductor switching element 32 in second turn-off circuit 30 can be determined based on the detection value of the gate current that flows at the time of turn-off. Therefore, in consideration of delay time DT2 by delay circuit 51 and the delay time produced in comparator 44 and arithmetic logic unit 45, semiconductor switching element 32 in second turn-off circuit 30 can be switched to the conducting state at time t24 which is timing of start of increase in collector-emitter voltage Vce as a result of the operation of first turn-off circuit 12. Consequently, variation in voltage (dV/dt) of power semiconductor element 1 can be steep and turn-off loss can further be reduced. Since drive circuit 104 further includes voltage clamp circuit 20A, the voltage across the main electrodes (that is, collector-emitter voltage Vce) of power semiconductor element 1 can be suppressed.

Modification of Fifth Embodiment

Figure 11:
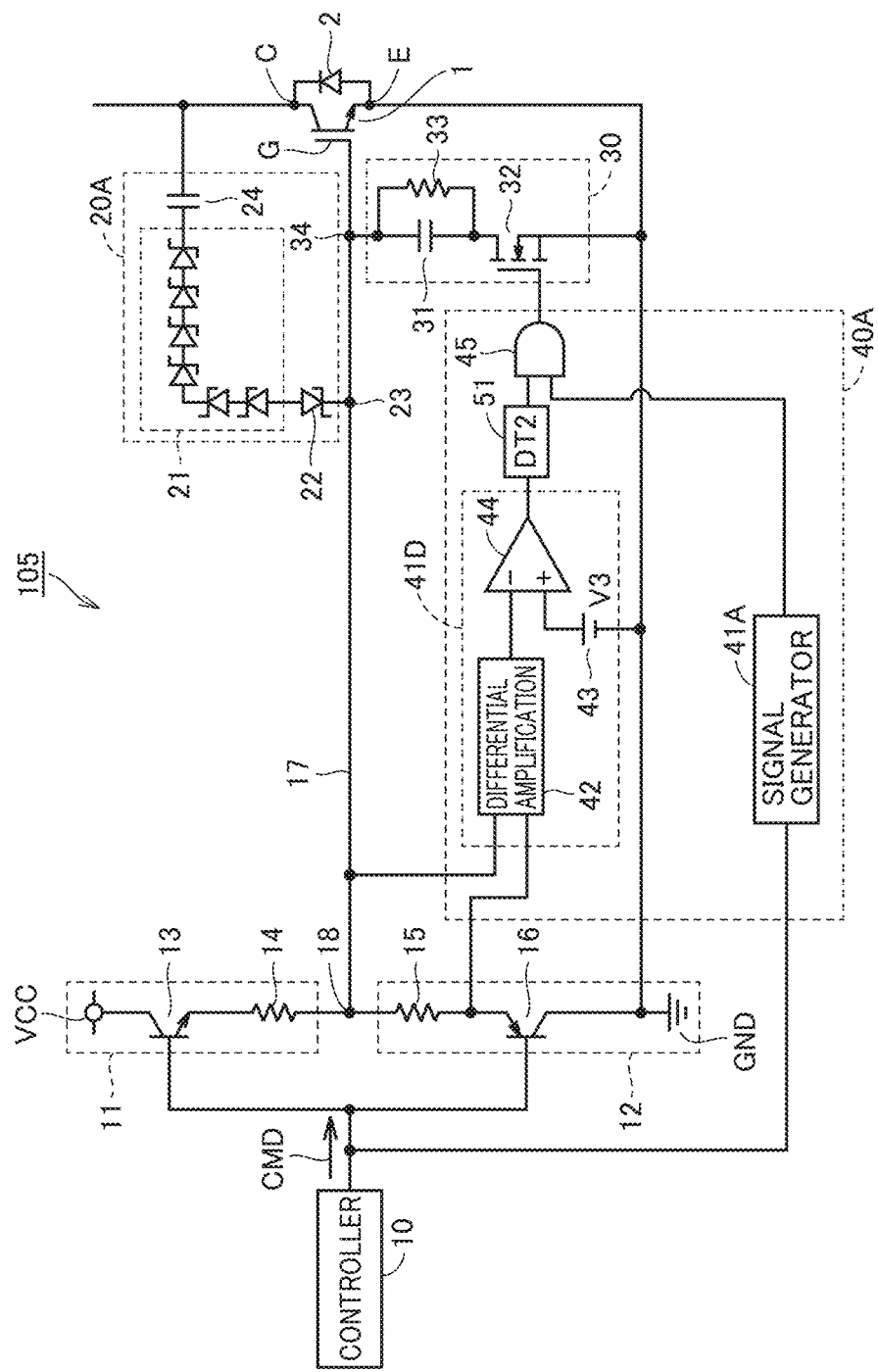
FIG. 11 is a circuit diagram showing a configuration of a drive circuit according to a modification of the fifth embodiment.

FIG. 11 is a circuit diagram showing a configuration of a drive circuit 105 according to a modification of the fifth embodiment. Drive circuit 105 in FIG. 11 is different from drive circuit 104 in FIG. 9 in that a second signal generator 41D obtains a value of the gate current based on voltage lowering in off gate resistor 15 provided in first turn-off circuit 12 instead of the detection value from current sensor 60. Therefore, differential amplifier 42 in second signal generator 41D functions as the gate current detection circuit to detect the gate current based on a voltage across opposing ends of off gate resistor 15.

Since FIG. 11 is otherwise similar to FIGS. 7 and 9, the same or corresponding elements have the same reference numerals allotted and description will not be repeated.

Sixth Embodiment

Figure 12:
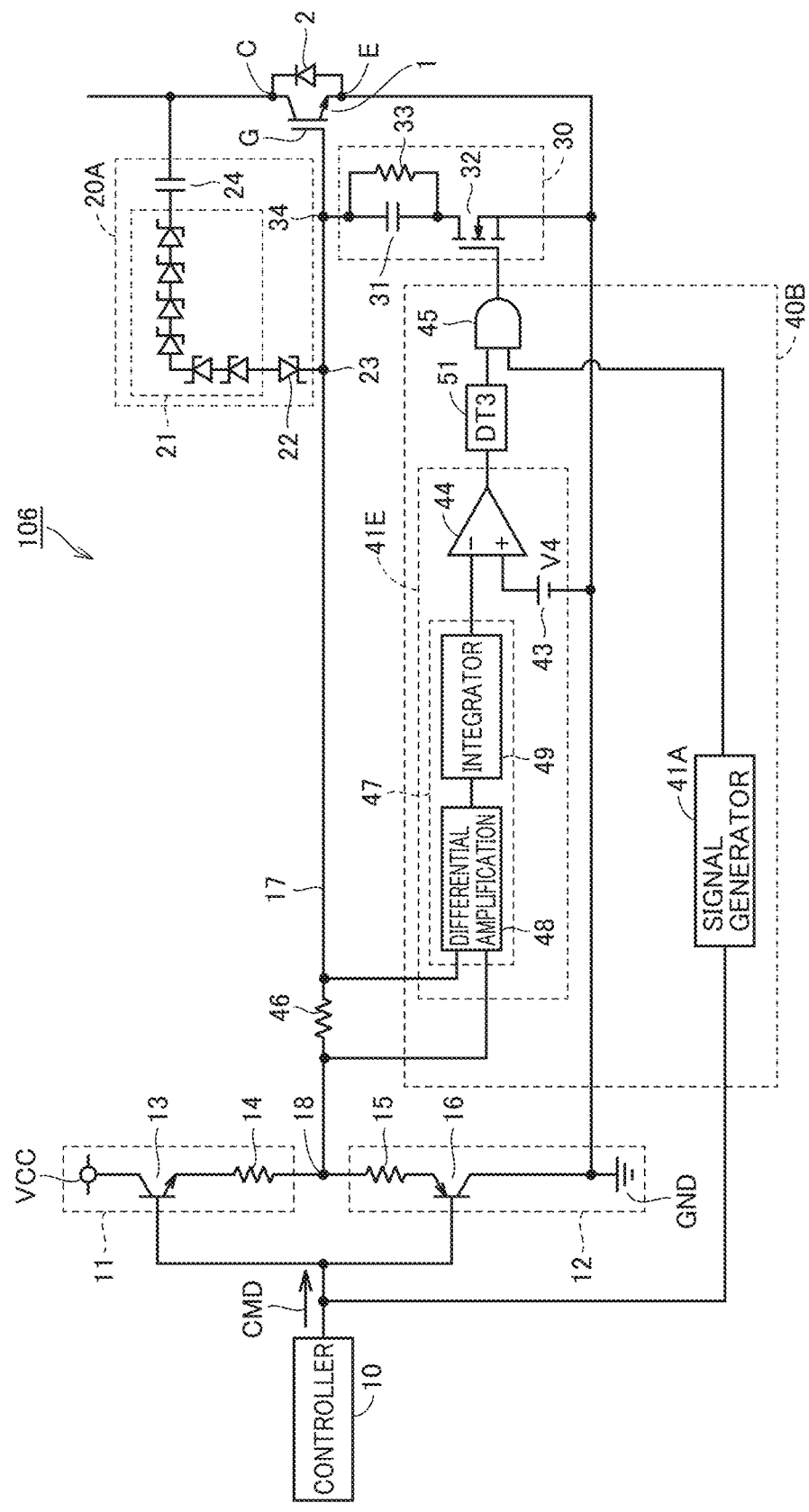
FIG. 12 is a circuit diagram showing a configuration of a drive circuit to drive the power semiconductor element according to a sixth embodiment.

FIG. 12 is a circuit diagram showing a configuration of a drive circuit 106 to drive power semiconductor element 1 according to a sixth embodiment. In drive circuit 106 in the sixth embodiment, a second signal generator 41E is different in function from second signal generator 41B in drive circuit 103 in the fourth embodiment and from second signal generators 41C and 41D in drive circuits 104 and 105 in the fifth embodiment.

Specifically, second signal generator 41E in FIG. 12 detects an amount of charges that flow into or out of control electrode G of power semiconductor element 1 by integrating the gate current detected by a gate resistor 46 provided in control electrode line 17. Second signal generator 41E then outputs the pulsed signal set to the H level for a certain period when the amount of charges accumulated in control electrode G of power semiconductor element 1 at the time of turn-off becomes smaller than a reference value (corresponding to a reference voltage V4). Alternatively, signal generator 41E may output the pulsed signal set to the H level for a certain period when the amount of charges that flow out of control electrode G at the time of turn-off becomes larger than a reference value (corresponding to a reference voltage V5 in FIG. 14).

As shown in FIG. 12, more specifically, signal generator 41E includes a differential amplifier 48, an integrator 49, comparator 44, and DC power supply 43. Differential amplifier 48 detects a current that flows through control electrode line 17 based on a voltage applied across opposing ends of gate resistor 46. Integrator 49 detects the amount of charges that flow into and out of control electrode G of power semiconductor element 1 by integrating the gate current detected by differential amplifier 48. Therefore, differential amplifier 48 and integrator 49 implement a charge amount detection circuit 47 to detect the amount of charges accumulated in control electrode G of power semiconductor element 1. Comparator 44 outputs the pulsed signal set to the H level for a certain period when the amount of accumulated charges detected by charge amount detection circuit 47 becomes smaller than the reference value (corresponding to reference voltage V4) at the time of turn-off of power semiconductor element 1.

Since FIG. 12 is otherwise similar to FIGS. 7, 9, and 11, the same or corresponding elements have the same reference numerals allotted and description will not be repeated.

Figure 13:
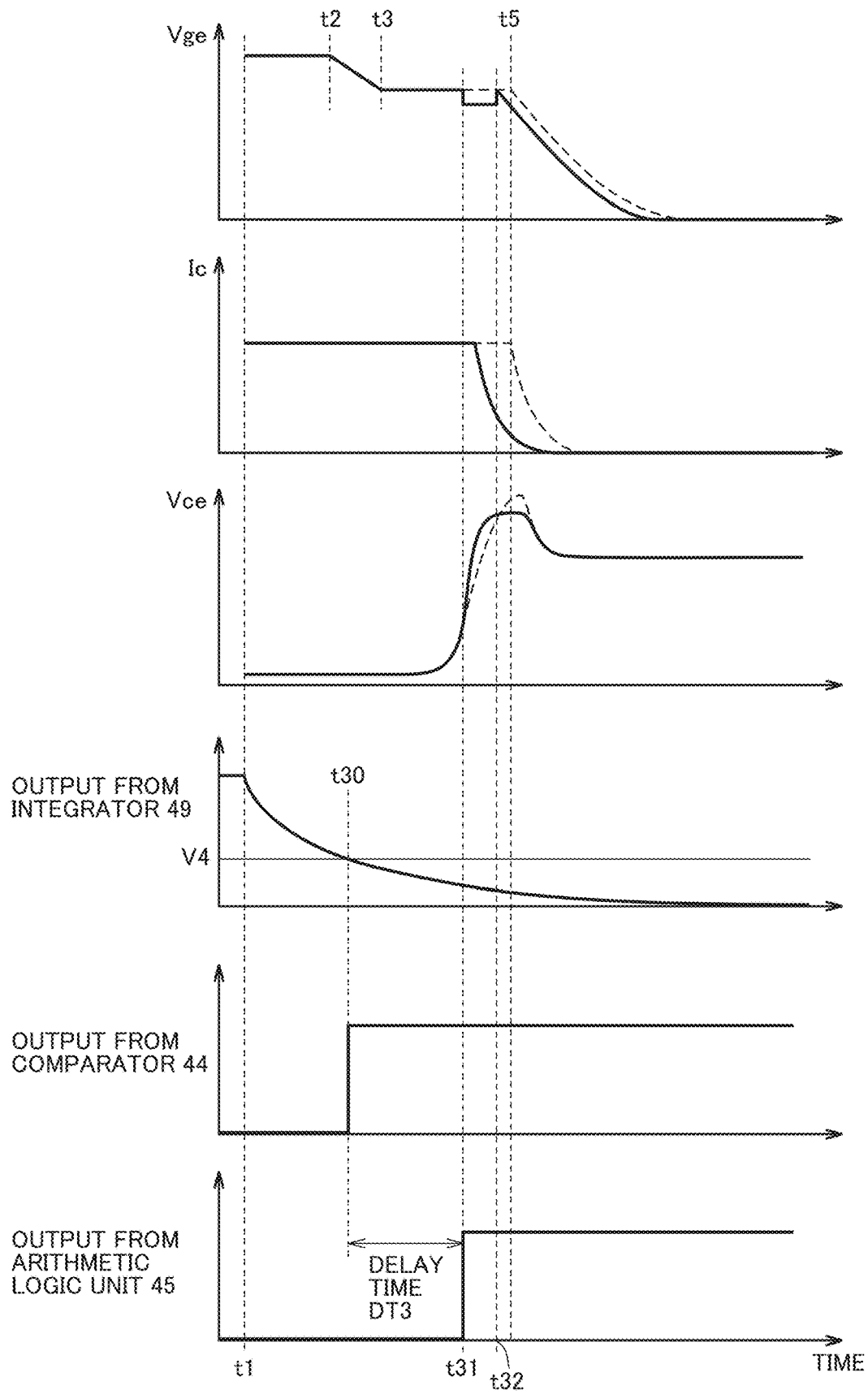
FIG. 13 is a diagram schematically showing a voltage or current waveform of each element at the time of turn-off by the drive circuit in the sixth embodiment shown in FIG. 12.

FIG. 13 is a diagram schematically showing a voltage or current waveform of each element at the time of turn-off by drive circuit 106 in the sixth embodiment shown in FIG. 12. FIG. 13 shows sequentially from the top, a waveform of each of gate-emitter voltage Vge of power semiconductor element 1, collector current Ic, collector-emitter voltage Vce, an output voltage from integrator 49, an output voltage from comparator 44, and an output voltage from arithmetic logic unit 45. The solid line indicates the waveform of the voltage or the current in the case of drive circuit 106 in the sixth embodiment. The dashed line indicates the waveform of the voltage or the current in the case of the comparative example in which neither of voltage clamp circuit 20 and second turn-off circuit 30 is provided in FIG. 1. Variation in waveform at time t2, time t3, and time t5 is the same as in FIG. 2.

Gate resistor 46 in FIG. 12 can detect any of the gate current in a positive direction in flow of charges into control electrode G of power semiconductor element 1 at the time of turn-on and the gate current in a negative direction in flow of charges out of control electrode G of power semiconductor element 1 at the time of turn-off. Therefore, the output from integrator 49 monotonously increases from 0 at the time of turn-on to reach a maximum value, and monotonously decreases from the maximum value at the time of turn-off to return to 0. FIG. 13 shows as the output voltage from integrator 49, the amount of gate charges at the time of turn-off. Therefore, after semiconductor switching element 16 in first turn-off circuit 12 switches from off to on based on the off command from controller 10 at time t1, the output voltage from integrator 49 monotonously decreases from the maximum value and returns to 0.

When the output voltage from integrator 49 becomes lower than reference voltage V4 at time t30, the output voltage from comparator 44 switches from the L level to the H level. The output signal from first signal generator 41A is assumed to have already switched from the L level to the H level when the first signal generator receives the off command from controller 10.

At time t31 after lapse of delay time DT3 by delay circuit 51 since time t30, the output voltage from arithmetic logic unit 45 switches from the L level to the H level. Since semiconductor switching element 32 is thus rendered conductive, the current suddenly flows through capacitor 31 in second turn-off circuit 30. Consequently, gate-emitter voltage Vge lowers, collector current Ic decreases, and collector-emitter voltage Vce increases. At next time t32, the current through capacitor 31 stops. A period from time t31 until time t32 is determined by the capacitance of capacitor 31. Therefore, the capacitance value of capacitor 31 is determined in advance such that increase in collector-emitter voltage Vce is also substantially clamped at time t32.

Thereafter, at any timing before next start of turn-on of power semiconductor element 1, first and second signal generators 41A and 41E set respective output voltages therefrom back to the L level to turn off semiconductor switching element 32.

The output voltage from integrator 49 becomes lower than the reference voltage also in an initial stage of a turn-on operation. First signal generator 41A is provided to prevent erroneous output during this period. First signal generator 41A outputs the pulsed signal set to the H level for a certain time period while controller 10 outputs the off command. A final output from turn-off control circuit 40B is obtained by logical AND of the output voltage from first signal generator 41A and a signal obtained by delay of the output voltage from second signal generator 41E.

Effects of Sixth Embodiment

As set forth above, according to drive circuit 106 to drive power semiconductor element 1 in the sixth embodiment, operation timing of semiconductor switching element 32 in second turn-off circuit 30 can be determined based on the value of the detected amount of charges in control electrode G at the time of turn-off. Therefore, in consideration of delay time DT3 by delay circuit 51 and the delay time produced in comparator 44 and arithmetic logic unit 45, semiconductor switching element 32 in second turn-off circuit 30 can be switched to the conducting state at time t31 which is timing of start of increase in collector-emitter voltage Vce as a result of the operation of first turn-off circuit 12. Consequently, variation in voltage (dV/dt) of power semiconductor element 1 can be steep and turn-off loss can further be reduced. Since drive circuit 106 further includes voltage clamp circuit 20A, the voltage across the main electrodes (that is, collector-emitter voltage Vce) of power semiconductor element 1 can be suppressed.

Modification of Sixth Embodiment

Figure 14:
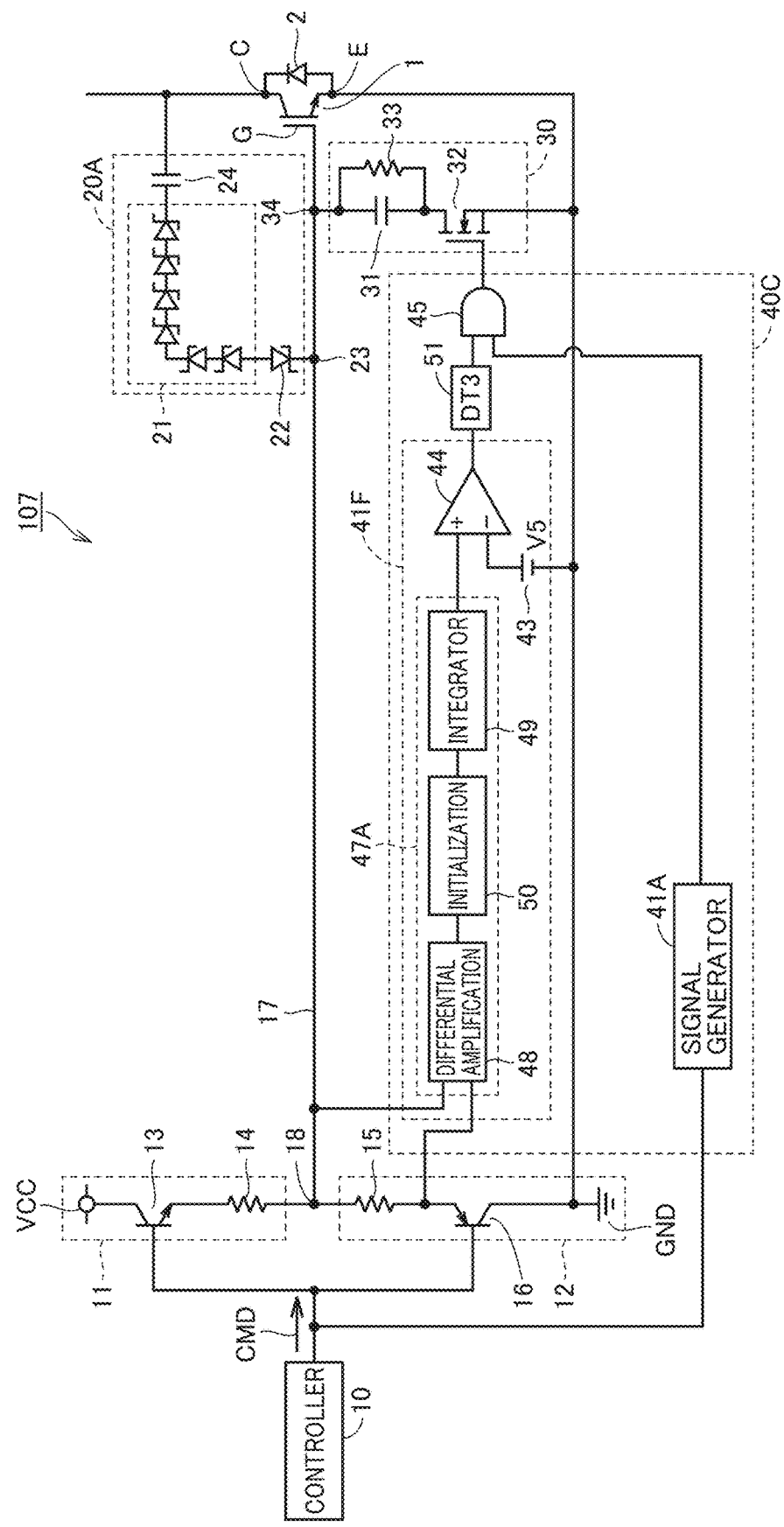
FIG. 14 is a circuit diagram showing a configuration of a drive circuit according to a modification of the sixth embodiment.

FIG. 14 is a circuit diagram showing a configuration of a drive circuit 107 according to a modification of the sixth embodiment. Drive circuit 107 in FIG. 14 is different from drive circuit 106 in FIG. 12 in that a second signal generator 41F detects a value of the gate current that flows through off gate resistor 15 in first turn-off circuit 12, instead of the value of the gate current that flows through gate resistor 46 provided in control electrode line 17.

A current flows through off gate resistor 15 in first turn-off circuit 12 in a direction from intermediate node 18 toward the GND node (in FIG. 14, the current in this direction being defined as positive) at the time of turn-off. The amount of charges that flow out of control electrode G can be detected by integration of this current that flows through off gate resistor 15 at the time of turn-off. This amount of charges that flow out monotonously increases from 0. In order to repeatedly measure the amount of charges that flow out each time power semiconductor element 1 is turned off, an integral obtained by integrator 49 should be initialized before next start of the turn-off operation. Therefore, a charge amount detection circuit 47A in second signal generator 41F of drive circuit 107 includes an initialization circuit 50 to initialize the integral calculated by integrator 49 in addition to differential amplifier 48 and integrator 49.

Comparator 44 in second signal generator 41F outputs a pulse voltage set to the H level for a certain time period when the amount of charges that flow out detected by charge amount detection circuit 47A exceeds the reference value (corresponding to reference voltage V5). When delay time DT3 by delay circuit 51 has elapsed since the amount of charges that flow out exceeded the reference value, the output voltage from arithmetic logic unit 45 switches from the L level to the H level. Semiconductor switching element 32 in second turn-off circuit 30 is thus rendered conductive.

As described with reference to FIGS. 12 and 13, in consideration of delay time DT3 by delay circuit 51 and the delay time produced in comparator 44 and arithmetic logic unit 45, semiconductor switching element 32 in second turn-off circuit 30 can be switched to the conducting state at the timing of start of increase in collector-emitter voltage Vce as a result of the operation of first turn-off circuit 12. Consequently, variation in voltage (dV/dt) of power semiconductor element 1 can be steep and turn-off loss can further be reduced. Since drive circuit 107 further includes voltage clamp circuit 20A, the voltage across the main electrodes (that is, collector-emitter voltage Vce) of power semiconductor element 1 can be suppressed.

Seventh Embodiment

Figure 15:
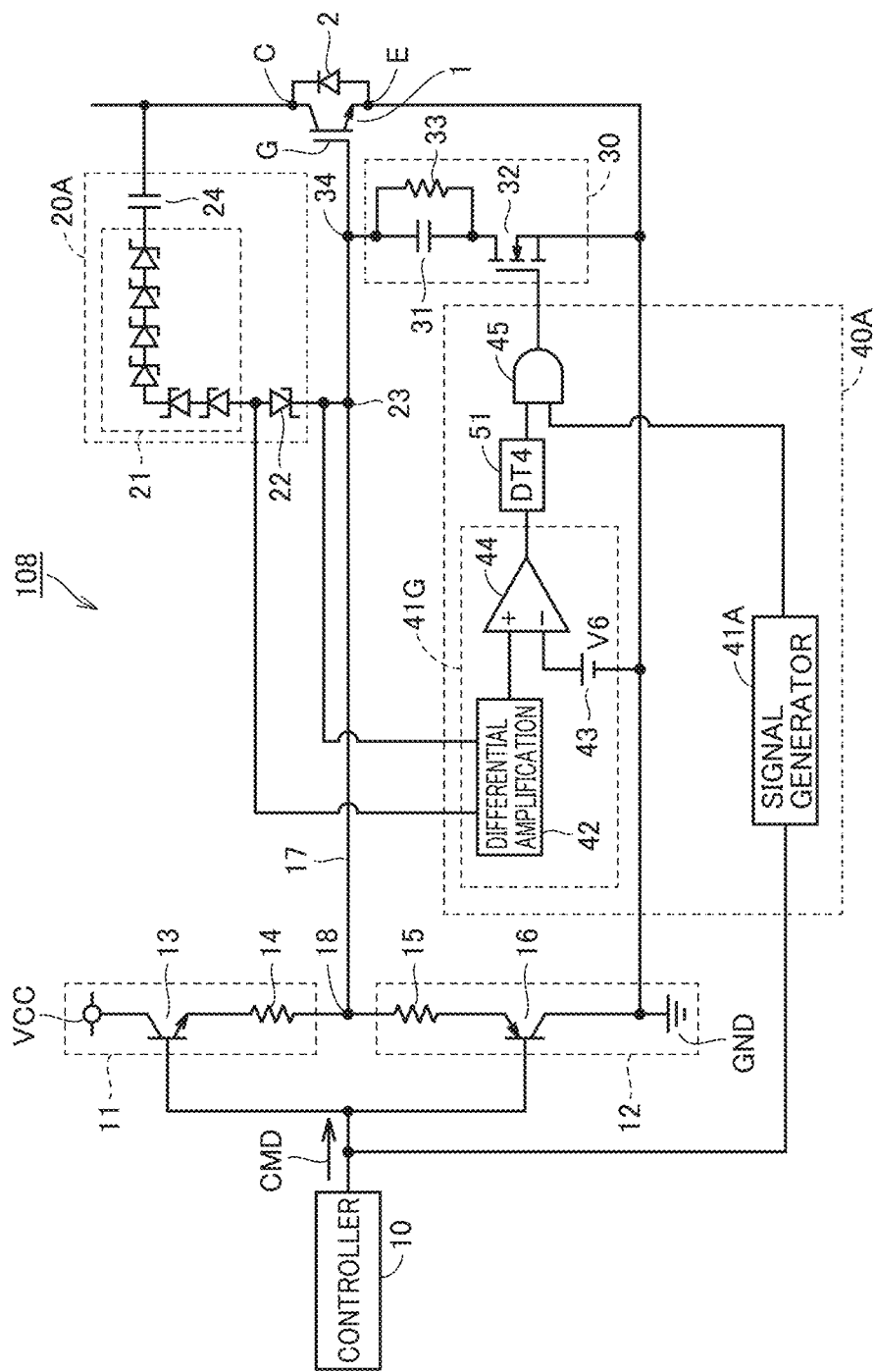
FIG. 15 is a circuit diagram showing a configuration of a drive circuit to drive the power semiconductor element according to a seventh embodiment.

FIG. 15 is a circuit diagram showing a configuration of a drive circuit 108 to drive power semiconductor element 1 according to a seventh embodiment. In turn-off control circuit 40A in drive circuit 108 in FIG. 15, a second signal generator 41G is different in function from second signal generators 41B, 41C, and 41D in FIGS. 7, 9, and 11.

Specifically, second signal generator 41G in turn-off control circuit 40A in FIG. 15 detects a voltage applied across the anode and the cathode of backflow prevention diode 22 in voltage clamp circuit 20A. The voltage is detected with the anode of backflow prevention diode 22 being defined as a positive side and the cathode thereof being defined as a negative side. Second signal generator 41G outputs the pulsed signal set to the H level for a certain period when the detected voltage, the voltage having been applied across opposing ends of backflow prevention diode 22, exceeds a reference voltage V6.

As shown in FIG. 15, more specifically, signal generator 41G includes differential amplifier 42, comparator 44, and DC power supply 43. Differential amplifier 42 detects the voltage applied across the anode and the cathode of backflow prevention diode 22 at the time of turn-off of power semiconductor element 1. Comparator 44 compares the output voltage from differential amplifier 42 with reference voltage V6 from DC power supply 43, and when the output voltage from differential amplifier 42 exceeds reference voltage V6, it outputs the pulsed signal set to the H level for a certain time period.

Since FIG. 15 is otherwise the same as FIGS. 7, 9, and 11 including second signal generators 41B, 41C, and 41D, the same or corresponding elements have the same reference numerals allotted and description will not be repeated.

Figure 16:
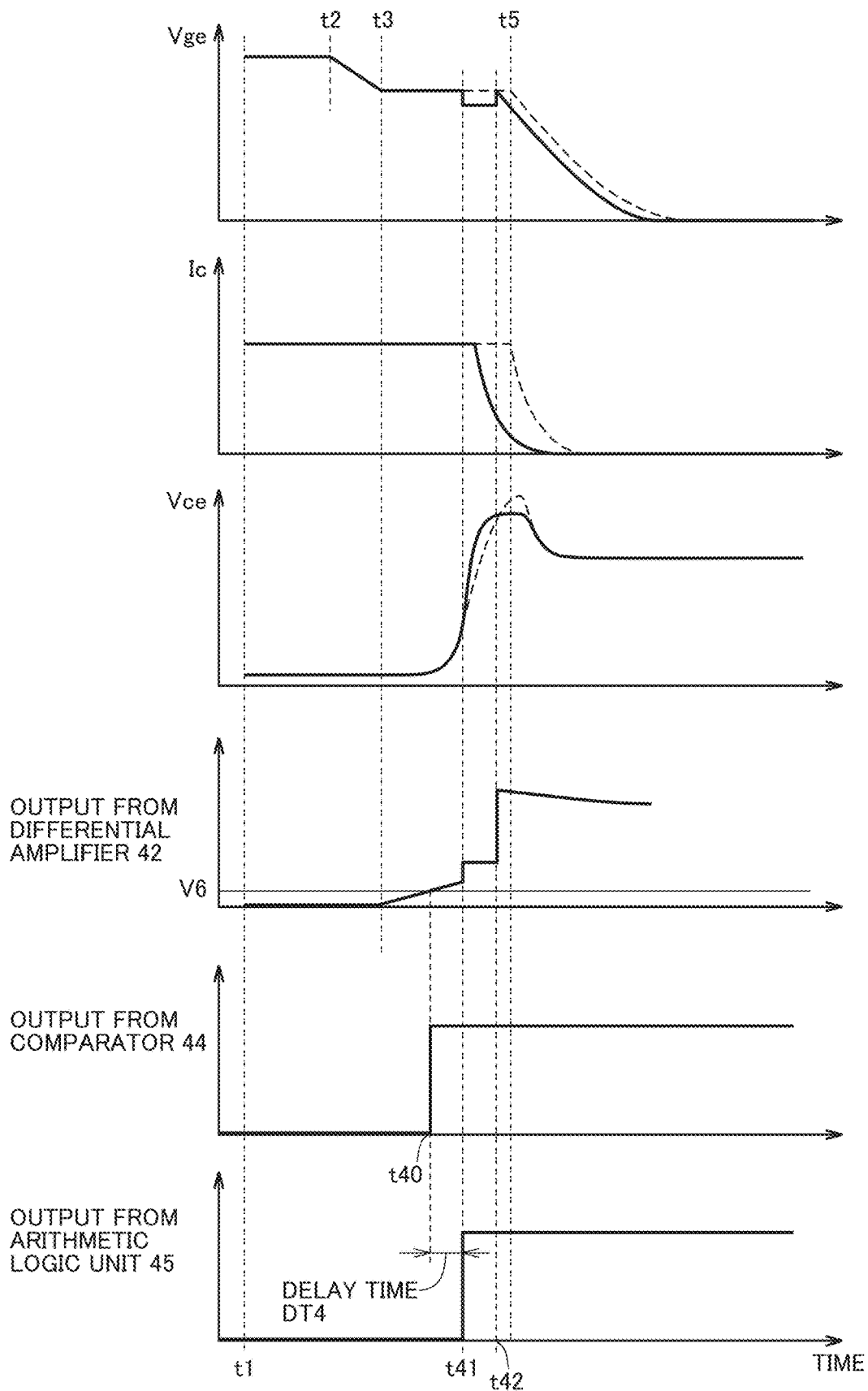
FIG. 16 is a diagram showing a voltage or current waveform of each element at the time of turn-off by the drive circuit in the seventh embodiment shown in FIG. 15.

FIG. 16 is a diagram showing a voltage or current waveform of each element at the time of turn-off by drive circuit 108 in the seventh embodiment shown in FIG. 15. FIG. 16 shows sequentially from the top, a waveform of each of gate-emitter voltage Vge of power semiconductor element 1, collector current Ic, collector-emitter voltage Vce, an output voltage from differential amplifier 42, an output voltage from comparator 44, and an output voltage from arithmetic logic unit 45. The solid line indicates the waveform of the voltage or the current in the case of drive circuit 108 in the seventh embodiment. The dashed line indicates the waveform of the voltage or the current in the case of the comparative example in which neither of voltage clamp circuit 20 and second turn-off circuit 30 is provided in FIG. 1. Variation in waveform at time t2, time t3, and time t5 is the same as in FIG. 2.

A cathode terminal of backflow prevention diode 22 is as high in potential as control electrode G of power semiconductor element 1. Therefore, the voltage across the anode and the cathode of backflow prevention diode 22 exhibits a waveform similar to that of gate-emitter voltage Vge of power semiconductor element 1. Specifically, the voltage across the anode and the cathode of backflow prevention diode 22 has a negative value at the time of turn-off, and exhibits a waveform like gate-emitter voltage Vge of power semiconductor element 1 being offset in the negative direction until start of the mirror period. Thereafter, when the mirror period comes at time t3 and gate-emitter voltage Vge attains to a constant value, in response thereto, the voltage across the anode and the cathode of backflow prevention diode 22 increases.

Reference voltage V6 of DC power supply 43 is set to a value slightly larger than the value thereof at the time when the mirror period comes. At time t40 at which the voltage across the anode and the cathode (that is, the output voltage from differential amplifier 42) of backflow prevention diode 22 becomes higher than reference voltage V6, the output signal from comparator 44 switches from the L level to the H level. An output signal from first signal generator 41A is assumed to have already switched from the L level to the H level when the first signal generator receives the off command from controller 10.

At time t41 after lapse of delay time DT4 by delay circuit 51 since time t40, the output voltage from arithmetic logic unit 45 switches from the L level to the H level. Since semiconductor switching element 32 is thus rendered conductive, the current suddenly flows through capacitor 31 in second turn-off circuit 30. Consequently, gate-emitter voltage Vge lowers, collector current Ic decreases, collector-emitter voltage Vce increases, and the voltage across the anode and the cathode of backflow prevention diode 22 increases. At next time t42, the current through capacitor 31 stops. A period from time t41 until time t42 is determined by the capacitance of capacitor 31. Therefore, the capacitance value of capacitor 31 is determined in advance such that increase in collector-emitter voltage Vce is also substantially clamped at time t42.

Thereafter, at any timing before next start of turn-on of power semiconductor element 1, first and second signal generators 41A and 41G set the respective output voltages therefrom back to the L level to set semiconductor switching element 32 to off.

Effects of Seventh Embodiment

As set forth above, according to drive circuit 108 to drive power semiconductor element 1 in the seventh embodiment, the operation timing of semiconductor switching element 32 in second turn-off circuit 30 can be determined based on the value of the detected voltage across the anode and the cathode of backflow prevention diode 22 in voltage clamp circuit 20A. Therefore, in consideration of delay time DT4 by delay circuit 51 and the delay time produced in comparator 44 and arithmetic logic unit 45, semiconductor switching element 32 in second turn-off circuit 30 can be switched to the conducting state at time t41 which is timing of start of increase in collector-emitter voltage Vce as a result of the operation of first turn-off circuit 12. Consequently, variation in voltage (dV/dt) of power semiconductor element 1 can be steep and turn-off loss can further be reduced. Since drive circuit 108 further includes voltage clamp circuit 20A, the voltage across the main electrodes (that is, collector-emitter voltage Vce) of power semiconductor element 1 can be suppressed.

Eighth Embodiment

In an eighth embodiment, an example in which a turn-off control circuit is configured by combination of a plurality of second signal generators among second signal generators 41B to 41G described in the fourth to seventh embodiments will be described.

First Example

Figure 17:
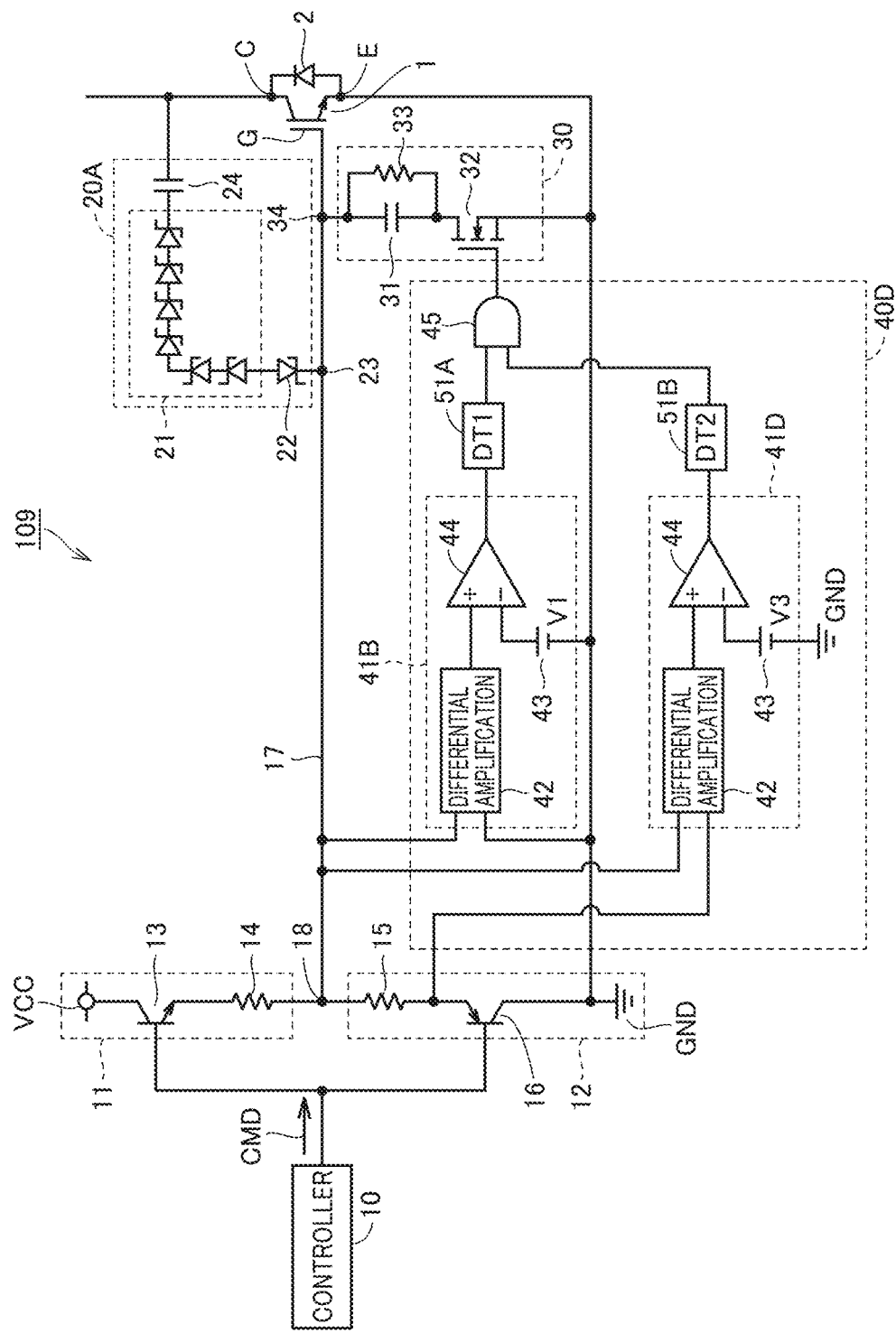
FIG. 17 is a circuit diagram showing a configuration of a drive circuit to drive the power semiconductor element according to a first example of an eighth embodiment.

FIG. 17 is a circuit diagram showing a configuration of a drive circuit 109 to drive power semiconductor element 1 according to a first example of the eighth embodiment. A turn-off control circuit 40D of drive circuit 109 in FIG. 17 includes signal generator 41B described with reference to FIG. 7, signal generator 41D described with reference to FIG. 11, delay circuits 51A and 51B, and arithmetic logic unit 45.

Signal generator 41B detects a voltage across control electrode G and second main electrode E on the low potential side of power semiconductor element 1, and when the detected voltage becomes lower than reference voltage V1, the signal generator outputs the pulsed signal set to the H level for a certain period. Reference voltage V1 is set to a value smaller than a voltage of control electrode G while power semiconductor element 1 is on and larger than a mirror voltage at the time of turn-off of power semiconductor element 1.

Delay circuit 51A delays the output voltage from signal generator 41B by delay time DT1. The output voltage from delay circuit 51A thus switches from the L level to the H level at the timing of start of increase in collector-emitter voltage Vce as a result of the operation of first turn-off circuit 12.

Signal generator 41D detects the gate current based on voltage lowering caused in off gate resistor 15 provided in first turn-off circuit 12. Signal generator 41D outputs the pulsed signal set to the H level for a certain period when the absolute value of the detected gate current exceeds the peak value and thereafter becomes smaller than a reference value (corresponding to a reference voltage V3).

Delay circuit 51B delays the output voltage from signal generator 41D by delay time DT2. The output voltage from delay circuit 51B thus switches from the L level to the H level at timing of start of increase in collector-emitter voltage Vce as a result of the operation of first turn-off circuit 12.

Arithmetic logic unit 45 outputs the logical AND of outputs of delay circuit 51A and delay circuit 51B. As a result of switching of the output from arithmetic logic unit 45 from the L level to the H level, semiconductor switching element 32 in second turn-off circuit 30 is rendered conductive. Since FIG. 17 is otherwise the same in configuration as described in the fourth to seventh embodiments, the same or corresponding elements have the same reference numerals allotted and description will not be repeated.

According to the configuration above, semiconductor switching element 32 in second turn-off circuit 30 can be switched to the conducting state at timing of start of increase in collector-emitter voltage Vce as a result of the operation of first turn-off circuit 12. Variation in voltage (dV/dt) of power semiconductor element 1 can thus be steep and turn-off loss can further be reduced. Since drive circuit 109 further includes voltage clamp circuit 20A, the voltage across the main electrodes (that is, collector-emitter voltage Vce) of power semiconductor element 1 can be suppressed.

Second Example

Figure 18:
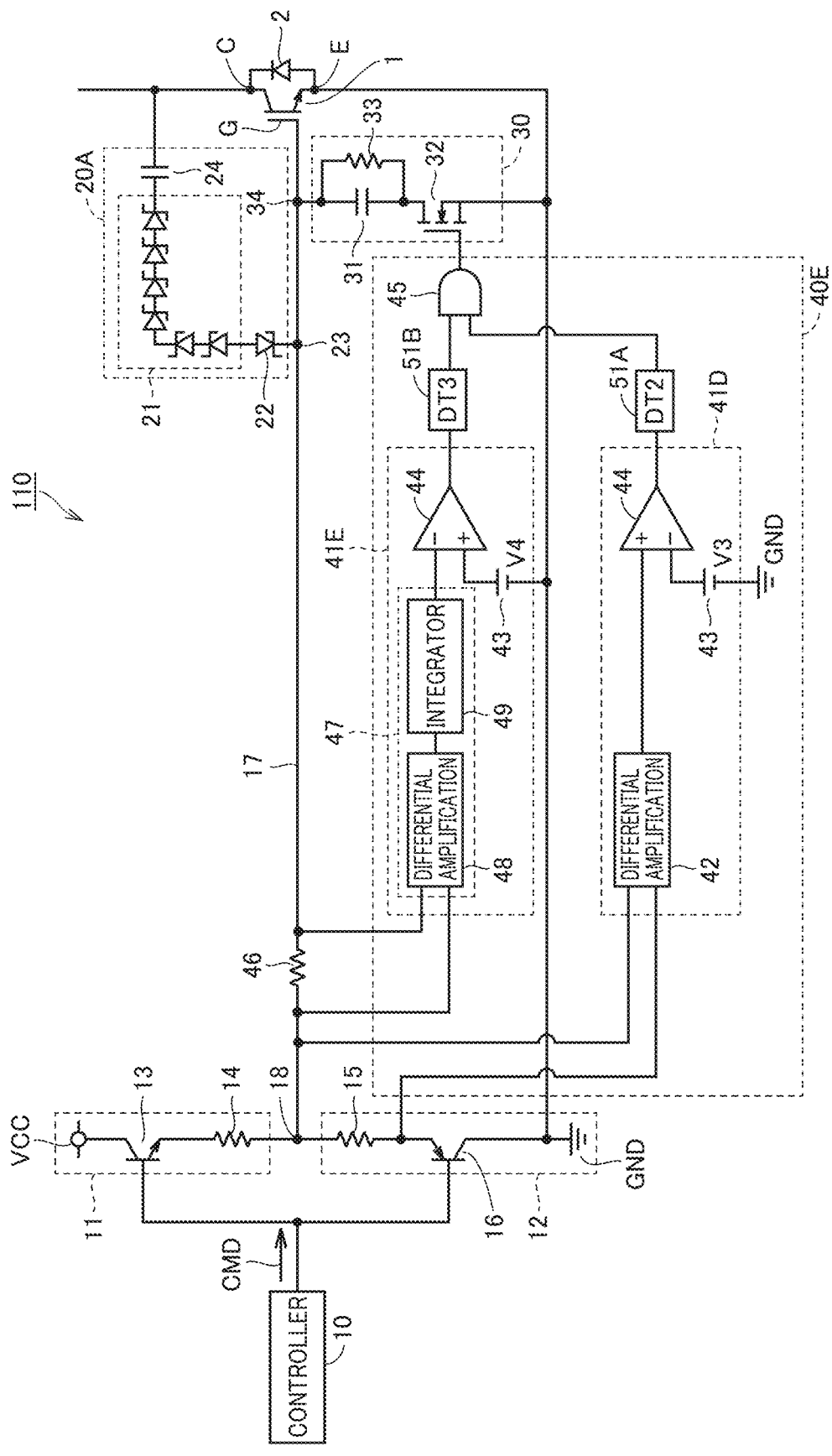
FIG. 18 is a circuit diagram showing a configuration of a drive circuit to drive the power semiconductor element according to a second example of the eighth embodiment.

FIG. 18 is a circuit diagram showing a configuration of a drive circuit 110 to drive power semiconductor element 1 according to a second example of the eighth embodiment. A turn-off control circuit 40E of drive circuit 110 in FIG. 18 includes signal generator 41D described with reference to FIG. 11, signal generator 41E described with reference to FIG. 12, delay circuits 51A and 51B, and arithmetic logic unit 45.

Signal generator 41D detects the gate current based on voltage lowering caused in off gate resistor 15 provided in first turn-off circuit 12. Signal generator 41D outputs the pulsed signal set to the H level for a certain period when the absolute value of the detected gate current exceeds the peak value and thereafter becomes smaller than the reference value (corresponding to reference voltage V3).

Delay circuit 51A delays the output voltage from signal generator 41D by delay time DT2. The output voltage from delay circuit 51A thus switches from the L level to the H level at the timing of start of increase in collector-emitter voltage Vce as a result of the operation of first turn-off circuit 12.

Signal generator 41E detects an amount of charges that flow into and out of control electrode G of power semiconductor element 1 by integrating the gate current detected by gate resistor 46 provided in control electrode line 17. Second signal generator 41E then outputs the pulsed signal set to the H level for a certain period when the amount of charges accumulated in control electrode G of power semiconductor element 1 at the time of turn-off becomes smaller than the reference value (corresponding to reference voltage V4).

Delay circuit 51B delays the output voltage from signal generator 41E by delay time DT3. The output voltage from delay circuit 51B thus switches from the L level to the H level at timing of start of increase in collector-emitter voltage Vce as a result of the operation of first turn-off circuit 12.

Arithmetic logic unit 45 outputs the logical AND of delay circuit 51A and delay circuit 51B. As a result of switching of the output from arithmetic logic unit 45 from the L level to the H level, semiconductor switching element 32 in second turn-off circuit 30 is rendered conductive. Since FIG. 18 is otherwise the same in configuration as described in the fourth to seventh embodiments, the same or corresponding elements have the same reference numerals allotted and description will not be repeated.

According to the configuration above, semiconductor switching element 32 in second turn-off circuit 30 can be switched to the conducting state at timing of start of increase in collector-emitter voltage Vce as a result of the operation of first turn-off circuit 12. Variation in voltage (dV/dt) of power semiconductor element 1 can thus be steep and turn-off loss can further be reduced. Since drive circuit 110 further includes voltage clamp circuit 20A, the voltage across the main electrodes (that is, collector-emitter voltage Vce) of power semiconductor element 1 can be suppressed.

Third Example

Figure 19:
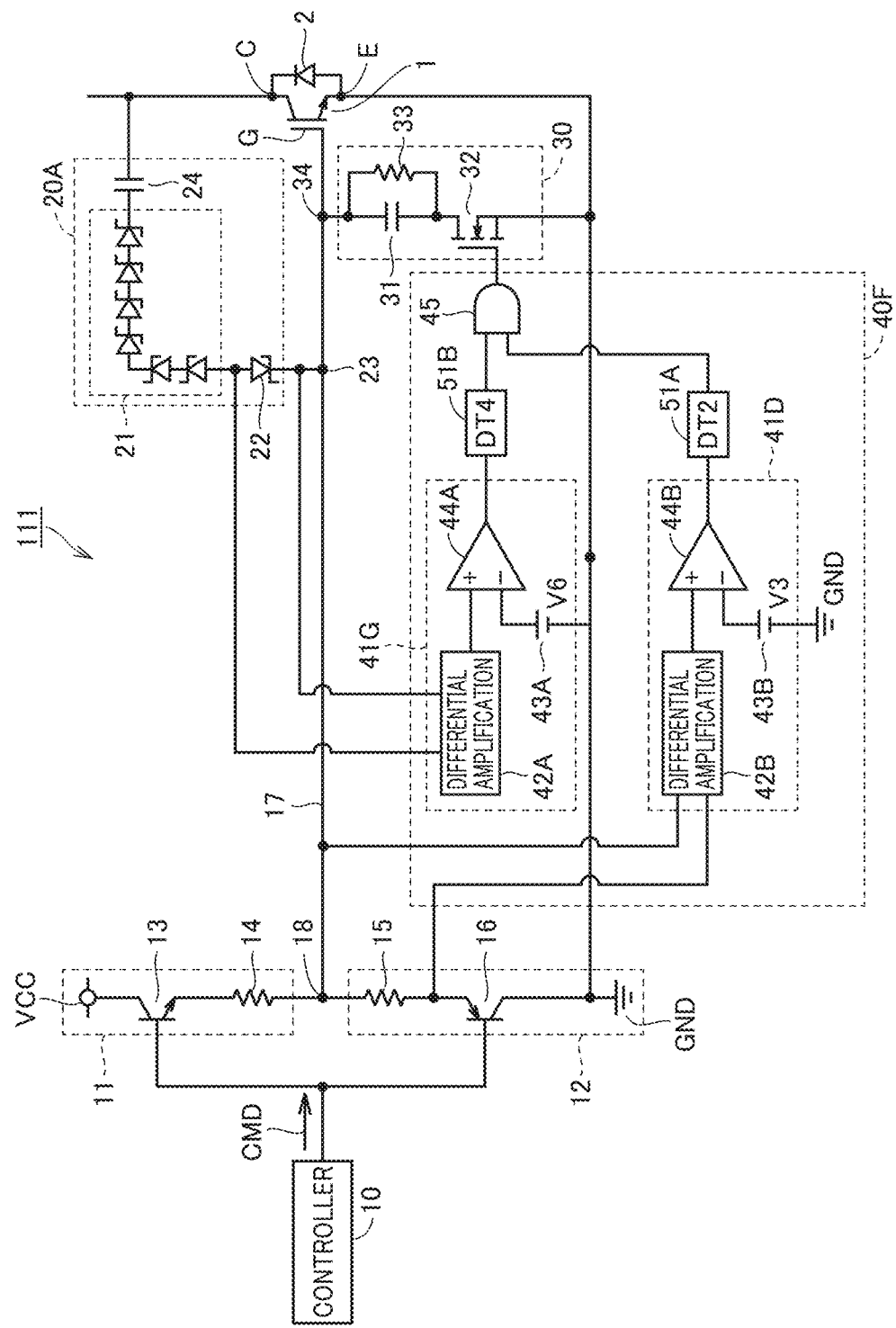
FIG. 19 is a circuit diagram showing a configuration of a drive circuit to drive the power semiconductor element according to a third example of the eighth embodiment.

FIG. 19 is a circuit diagram showing a configuration of a drive circuit 111 to drive power semiconductor element 1 according to a third example of the eighth embodiment. A turn-off control circuit 40F of drive circuit 111 in FIG. 19 includes signal generator 41D described with reference to FIG. 11, signal generator 41G described with reference to FIG. 15, delay circuits 51A and 51B, and arithmetic logic unit 45.

Signal generator 41D detects the gate current based on voltage lowering caused in off gate resistor 15 provided in first turn-off circuit 12. Signal generator 41D outputs the pulsed signal set to the H level for a certain period when the absolute value of the detected gate current exceeds the peak value and thereafter becomes smaller than the reference value (corresponding to reference voltage V3).

Delay circuit 51A delays the output voltage from signal generator 41D by delay time DT2. The output voltage from delay circuit 51A thus switches from the L level to the H level at the timing of start of increase in collector-emitter voltage Vce as a result of the operation of first turn-off circuit 12.

Signal generator 41G detects a voltage applied across the anode and the cathode of backflow prevention diode 22 in voltage clamp circuit 20A. The voltage is detected with the anode of backflow prevention diode 22 being defined as the positive side and the cathode thereof being defined as the negative side. Second signal generator 41G then outputs the pulsed signal set to the H level for a certain period when the detected voltage, the voltage having been applied across opposing ends of backflow prevention diode 22, exceeds reference voltage V6.

Delay circuit 51B delays the output voltage from signal generator 41G by delay time DT4. The output voltage from delay circuit 51B thus switches from the L level to the H level at timing of start of increase in collector-emitter voltage Vce as a result of the operation of first turn-off circuit 12.

Arithmetic logic unit 45 outputs the logical AND of outputs of delay circuit 51A and delay circuit 51B. As a result of switching of the output from arithmetic logic unit 45 from the L level to the H level, semiconductor switching element 32 in second turn-off circuit 30 is rendered conductive. Since FIG. 19 is otherwise the same in configuration as described in the fourth to seventh embodiments, the same or corresponding elements have the same reference numerals allotted and description will not be repeated.

According to the configuration above, semiconductor switching element 32 in second turn-off circuit 30 can be switched to the conducting state at timing of start of increase in collector-emitter voltage Vce as a result of the operation of first turn-off circuit 12. Variation in voltage (dV/dt) of power semiconductor element 1 can thus be steep and turn-off loss can further be reduced. Since drive circuit 111 further includes voltage clamp circuit 20A, the voltage across the main electrodes (that is, collector-emitter voltage Vce) of power semiconductor element 1 can be suppressed.

Ninth Embodiment

Figure 20:
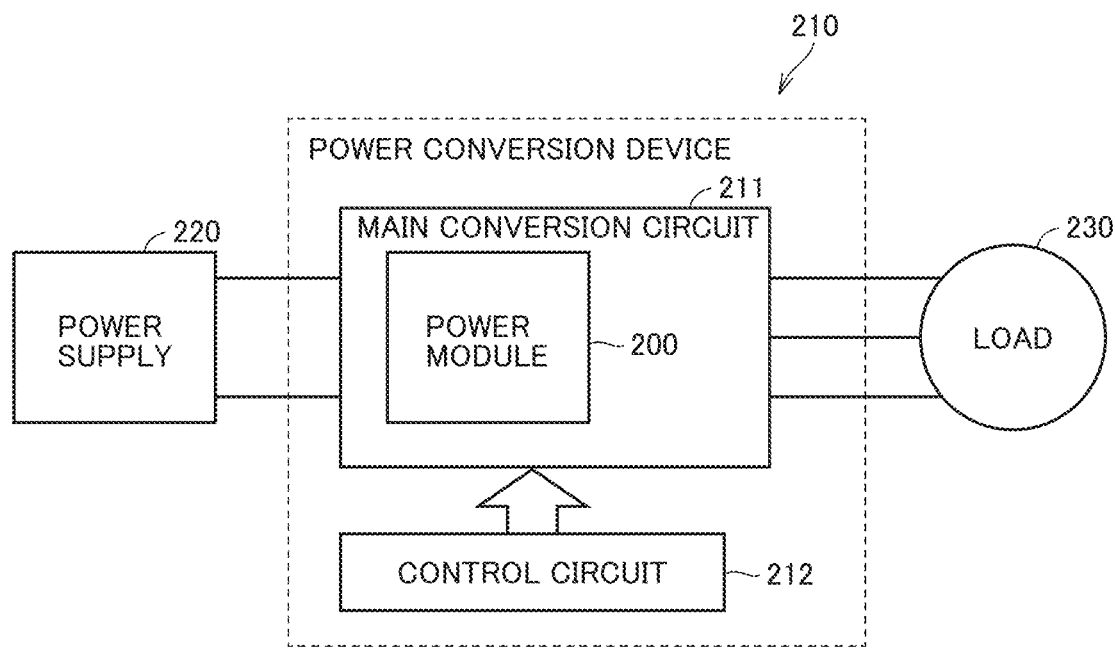
FIG. 20 is a block diagram showing a configuration of a power conversion system to which a power conversion device according to a ninth embodiment is applied.

FIG. 20 is a block diagram showing a configuration of a power conversion system to which a power conversion device according to a ninth embodiment is applied.

The power conversion system shown in FIG. 20 includes a power supply 220, a power conversion device 210, and a load 230. Power supply 220 is a DC power supply and supplies DC power to power conversion device 210. Power supply 220 can be implemented by various devices such as a DC system, a photovoltaic cell, or a storage battery, or by a rectification circuit or an alternating-current (AC)/DC converter connected to an AC system. Power supply 220 may be implemented by a DC/DC converter that converts DC power outputted from the DC system into set electric power.

Power conversion device 210 is a three-phase inverter connected between power supply 220 and load 230, and it converts DC power supplied from power supply 220 into AC power and supplies AC power to load 230. As shown in FIG. 20, power conversion device 210 includes a main conversion circuit 211 to convert DC power into AC power and output AC power and a control circuit 212 to output a control signal for controlling main conversion circuit 211 to main conversion circuit 211.

Load 230 is a three-phase motor driven by AC power supplied from power conversion device 210. Load 230 is not limited to a specific application, and it is a motor mounted on various electrical appliances and used, for example, as a motor for a hybrid vehicle, an electric vehicle, a rolling stock, an elevator, or an air-conditioner.

Details of power conversion device 210 will be described below. Main conversion circuit 211 includes a switching element and a freewheeling diode (not shown). As the switching element switches, DC power supplied from power supply 220 is converted into AC power, which is supplied to load 230. Though a specific circuit configuration of main conversion circuit 211 is various, main conversion circuit 211 according to the present embodiment is a two-level three-phase full bridge circuit and can be constituted of six switching elements and six freewheeling diodes in antiparallel to respective switching elements. At least any one of the switching elements in main conversion circuit 211 is power semiconductor element 1 in any one of the first to eighth embodiments described above. Every two switching elements of the six switching elements are connected in series to implement upper and lower arms, and the upper and lower arms implement phases (the U phase, the V phase, and the W phase) of the full bridge circuit. Output terminals of the upper and lower arms, that is, three output terminals of main conversion circuit 211, are connected to load 230.

As described in the first to eighth embodiments above, any one (not shown) of drive circuits 100 to 111 to drive a switching element is contained in a power module 200. Therefore, main conversion circuit 211 includes any one of drive circuits 100 to 111. Any one of drive circuits 100 to 111 generates a drive signal to drive the switching element in main conversion circuit 211 and supplies the drive signal to the control electrode of the switching element in main conversion circuit 211. Specifically, the drive circuit outputs to the control electrode of each switching element, a drive signal to set the switching element to on and a drive signal to set the switching element to off in accordance with a control signal from control circuit 212 which will be described later. When the switching element is to be maintained on, the drive signal is a voltage signal (on signal) not lower than a threshold voltage of the switching element, and when the switching element is to be maintained off, the drive signal is a voltage signal (off signal) not higher than a threshold voltage of the switching element.

Control circuit 212 controls the switching element of main conversion circuit 211 such that desired electric power is supplied to load 230. Control circuit 212 corresponds to controller 10 in the first to eighth embodiments. More specifically, control circuit 212 calculates a time period (an on time period) during which each switching element of main conversion circuit 211 should be on based on electric power to be supplied to load 230. For example, main conversion circuit 211 can be controlled under PWM control in which an on time period of the switching element is modulated in accordance with a voltage to be outputted. Then, control circuit 212 outputs a control command (a control signal) to any of drive circuits 100 to 111 provided in main conversion circuit 211 such that an on signal is outputted to the switching element to be turned on and an off signal is outputted to the switching element to be turned off at each time point. Drive circuits 100 to 111 each output the on signal or the off signal as the drive signal to the control electrode of each switching element, in accordance with the control signal.

Since power semiconductor element 1 and drive circuits 101 to 111 to drive the same according to the first to eighth embodiments are applied as power module 200 included in main conversion circuit 211 in the power conversion device according to the present embodiment, a power conversion device achieving both of suppression of the surge voltage and reduction in turn-off loss can be provided.

Though an example in which the present disclosure is applied to a two-level three-phase inverter is described in the present embodiment, the present disclosure can be applied to various power conversion devices without being limited as such. Though a two-level power conversion device is adopted in the present embodiment, a three-level power conversion device or a multi-level power conversion device may be applicable. In supply of electric power to a single-phase load, the present disclosure may be applied to a single-phase inverter. In supply of electric power to a DC load, the present disclosure can also be applied to a DC/DC converter or an AC/DC converter.

The power conversion device to which the present disclosure is applied is not limited to an above-described example in which a motor is adopted as the load, and the power conversion device can also be employed, for example, in a power supply apparatus of an electro-discharge machine or a laser drilling machine or a power supply apparatus of an induction heating cooker or a wireless power transfer system. The power conversion device to which the present disclosure is applied can also further be used as a power conditioner of a photovoltaic power system or a power storage system.

It should be understood that the embodiments disclosed herein are illustrative and non-restrictive in every respect. The scope of the present application is defined by the terms of the claims rather than the description above and is intended to include any modifications within the scope and meaning equivalent to the terms of the claims.

REFERENCE SIGNS LIST

1 power semiconductor element; 2 freewheeling diode; 10 controller; 11 turn-on circuit; 12 first turn-off circuit; 13, 16, 32 semiconductor switching element; 14 on gate resistor; 15 off gate resistor; 17 control electrode line; 18 intermediate node; 20, 20A voltage clamp circuit; 21 Zener diode (first diode); 22 backflow prevention diode (second diode); 24, 31 capacitor; 30, 30A second turn-off circuit; 33 resistor; 35 negative power supply; 40, 40A to 40F turn-off control circuit; 41, 41A to 41G signal generator; 42, 48 differential amplifier; 43 DC power supply; 44 comparator; 45 arithmetic logic unit; 46 gate resistor; 47, 47A charge amount detection circuit; 49 integrator; 50 initialization circuit; 51, 51A, 51B delay circuit; 52 amplifier; 60 current sensor; 100 to 111 drive circuit; 200 power module; 210 power conversion device; 211 main conversion circuit; 212 control circuit; 220 power supply; 230 load; C first main electrode (collector); DT1 to DT4 delay time; E second main electrode (emitter); G control electrode (gate); V1 to V6 reference voltage

The invention claimed is:

1. A drive circuit for a power semiconductor element, the power semiconductor element comprising a first main electrode on a high potential side, a second main electrode on a low potential side, and a control electrode, a state between the first main electrode and the second main electrode being switched between a conducting state and a non-conducting state in accordance with a voltage applied to the control electrode, the drive circuit comprising:
- a turn-on circuit to turn on the power semiconductor element by applying a first supply voltage to the control electrode in accordance with an on command from a controller;
- a first turn-off circuit to turn off the power semiconductor element by applying a second supply voltage to the control electrode in accordance with an off command from the controller;
- a voltage clamp circuit connected between the first main electrode and the control electrode;
- a second turn-off circuit comprising a capacitive element and a switching element connected in series between the control electrode and the second main electrode and a resistive element connected in parallel to the capacitive element; and
- a turn-off control circuit to control on and off of the switching element in the second turn-off circuit, wherein
the turn-off control circuit switches the switching element to on when a voltage across the first main electrode and the second main electrode increases after start of turn-off of the power semiconductor element by the first turn-off circuit.

2. The drive circuit according to claim 1, wherein
as the turn-off control circuit turns on the switching element, for a period in accordance with a capacitance value of the capacitive element, a gate current larger than a gate current that flows through the first turn-off circuit flows through the second turn-off circuit, and
the turn-off control circuit switches the switching element to off after lapse of the period in accordance with the capacitance value of the capacitive element.

3. The drive circuit according to claim 1, wherein
the turn-off control circuit comprises a first signal generator, and
the first signal generator receives the off command from the controller and outputs a signal for switching the switching element to on based on timing of reception of the off command.

4. The drive circuit according to claim 1, wherein
the turn-off control circuit comprises a second signal generator, and
the second signal generator detects a voltage across the control electrode and the second main electrode of the power semiconductor element when the power semiconductor element is turned off by the first turn-off circuit, and when the detected voltage becomes lower than a reference value, the second signal generator outputs a signal for switching the switching element to on.

5. The drive circuit according to claim 1, wherein
the turn-off control circuit comprises a second signal generator, and
the second signal generator detects a current that flows out of the control electrode when the power semiconductor element is turned off by the first turn-off circuit, and when an absolute value of the detected current attains to a peak value and thereafter becomes smaller than a reference value, the second signal generator outputs a signal for switching the switching element to on.

6. The drive circuit according to claim 1, wherein
the turn-off control circuit comprises a second signal generator, and
the second signal generator detects an amount of charges that flow out of the control electrode when the power semiconductor element is turned off by the first turn-off circuit, and when the detected amount of charges exceeds a first reference value or when an amount of charges that remain in the control electrode becomes smaller than a second reference value, the second signal generator outputs a signal for switching the switching element to on.

7. The drive circuit according to claim 1, wherein
the voltage clamp circuit comprises at least one Zener type first diode for voltage clamping and a second diode connected in series in an orientation reverse to the first diode, the first diode and the second diode being connected sequentially in series between the first main electrode and the control electrode,
the turn-off control circuit comprises a second signal generator, and
the second signal generator detects a voltage across an anode and a cathode of the second diode when the power semiconductor element is turned off by the first turn-off circuit, and when the detected voltage exceeds a reference value, the second signal generator outputs a signal for switching the switching element to on.

8. The drive circuit according to claim 1, wherein
the turn-off control circuit comprises
a first signal generator,
a second signal generator, and
an arithmetic logic unit,
the first signal generator detects a voltage across the control electrode and the second main electrode of the power semiconductor element, and when the detected voltage becomes lower than a first reference value, the first signal generator outputs a first signal,
the second signal generator detects a current that flows out of the control electrode, and when an absolute value of the detected current attains to a peak value and thereafter becomes smaller than a second reference value, the second signal generator outputs a second signal, and
the arithmetic logic unit outputs a signal for switching the switching element to on based on the first signal and the second signal.

9. The drive circuit according to claim 1, wherein
the turn-off control circuit comprises
a first signal generator,
a second signal generator, and
an arithmetic logic unit,
the first signal generator detects a current that flows out of the control electrode, and when an absolute value of the detected current attains to a peak value and thereafter becomes smaller than a first reference value, the first signal generator outputs a first signal,
the second signal generator detects an amount of charges that flow out of the control electrode, and when the detected amount of charges exceeds a second reference value or when an amount of charges that remain in the control electrode becomes smaller than a third reference value, the second signal generator outputs a second signal, and the arithmetic logic unit outputs a signal for switching the switching element to on based on the first signal and the second signal.

10. The drive circuit according to claim 1, wherein the voltage clamp circuit comprises at least one Zener type first diode for voltage clamping and a second diode connected in series in an orientation reverse to the first diode, the first diode and the second diode being connected sequentially in series between the first main electrode and the control electrode, the turn-off control circuit comprises a first signal generator, a second signal generator, and an arithmetic logic unit, the first signal generator detects a current that flows out of the control electrode, and when an absolute value of the detected current attains to a peak value and thereafter becomes smaller than a first reference value, the first signal generator outputs a first signal, the second signal generator detects a voltage across an anode and a cathode of the second diode, and when the detected voltage exceeds a second reference value, the second signal generator outputs a second signal, and the arithmetic logic unit outputs a signal for switching the switching element to on based on the first signal and the second signal.

11. The drive circuit according to claim 1, wherein the second turn-off circuit further comprises a negative power supply, and the capacitive element, the switching element, and the negative power supply are connected in series sequentially between the control electrode and the second main electrode.

12. The drive circuit according to claim 1, wherein the second turn-off circuit comprises a passive component portion comprising the capacitive element and the resistive element, the passive component portion being connected in series with the switching element, and the passive component portion has a time constant not more than five microseconds.

13. A power semiconductor module comprising:

the power semiconductor element according to claim 1; and the drive circuit according to claim 1.

14. A power conversion device incorporating:

the power semiconductor element according to claim 1; and the drive circuit according to claim 1.

* * * * *